United States Patent
Vu

(12) 
(10) Patent No.: US 6,283,155 B1
(45) Date of Patent: Sep. 4, 2001

(54) SYSTEM OF MODULAR SUBSTRATES FOR ENABLING THE DISTRIBUTION OF PROCESS FLUIDS THROUGH REMOVABLE COMPONENTS

(75) Inventor: Kim Ngoc Vu, Yorba Linda, CA (US)

(73) Assignee: Insync Systems, Inc., Milpitas, CA (US)

(*) Notice: Subject to any disclaimer, the term of this patent is extended or adjusted under 35 U.S.C. 154(b) by 0 days.

(21) Appl. No.: 09/456,226

(22) Filed: Dec. 6, 1999

(51) Int. Cl.[7] ........................................... F16K 11/10
(52) U.S. Cl. ............................................ 137/884; 251/367
(58) Field of Search ...................... 137/269, 240, 137/613, 884; 251/367

(56) References Cited

U.S. PATENT DOCUMENTS

| | | |
|---|---|---|
| 3,572,368 | 3/1971 | Bullmer . |
| 3,863,666 | 2/1975 | Bonne et al. . |
| 3,915,194 | 10/1975 | Friedrich . |
| 4,524,807 | 6/1985 | Toliusis . |
| 4,657,047 | 4/1987 | Kolibas . |
| 4,848,393 | 7/1989 | West . |
| 5,178,191 | 1/1993 | Schaefer . |
| 5,301,717 | 4/1994 | Goedecke . |
| 5,368,062 | 11/1994 | Okumura et al. . |
| 5,439,026 | 8/1995 | Moriya et al. . |
| 5,662,143 | 9/1997 | Caughran . |
| 5,836,355 | 11/1998 | Markulec et al. . |
| 6,073,646 | * 6/2000 | Kimura ................. 137/315 |
| 6,085,783 | * 7/2000 | Hollingshead ......... 137/597 |
| 6,109,303 | * 8/2000 | Itafuji et al. ........... 137/884 |

FOREIGN PATENT DOCUMENTS 273027  3/1978 (DE) .

OTHER PUBLICATIONS

"The World Standard for Ultra Clean Gas Delivery Systems and Components" by Ultra Clean Technology Systems & Service, Inc.

* cited by examiner

Primary Examiner—John Fox
(74) Attorney, Agent, or Firm—Wolf, Greenfield & Sacks, P.C.

(57) ABSTRACT

A fluid panel subassembly comprising: a component; substrate a seal, a body, and an insert; wherein the body is fastened to the insert to form a substrate with the substrate seal therein, and the component is fastened to the body such that, the component is positioned over the substrate seal.

28 Claims, 26 Drawing Sheets

SECTION A-A

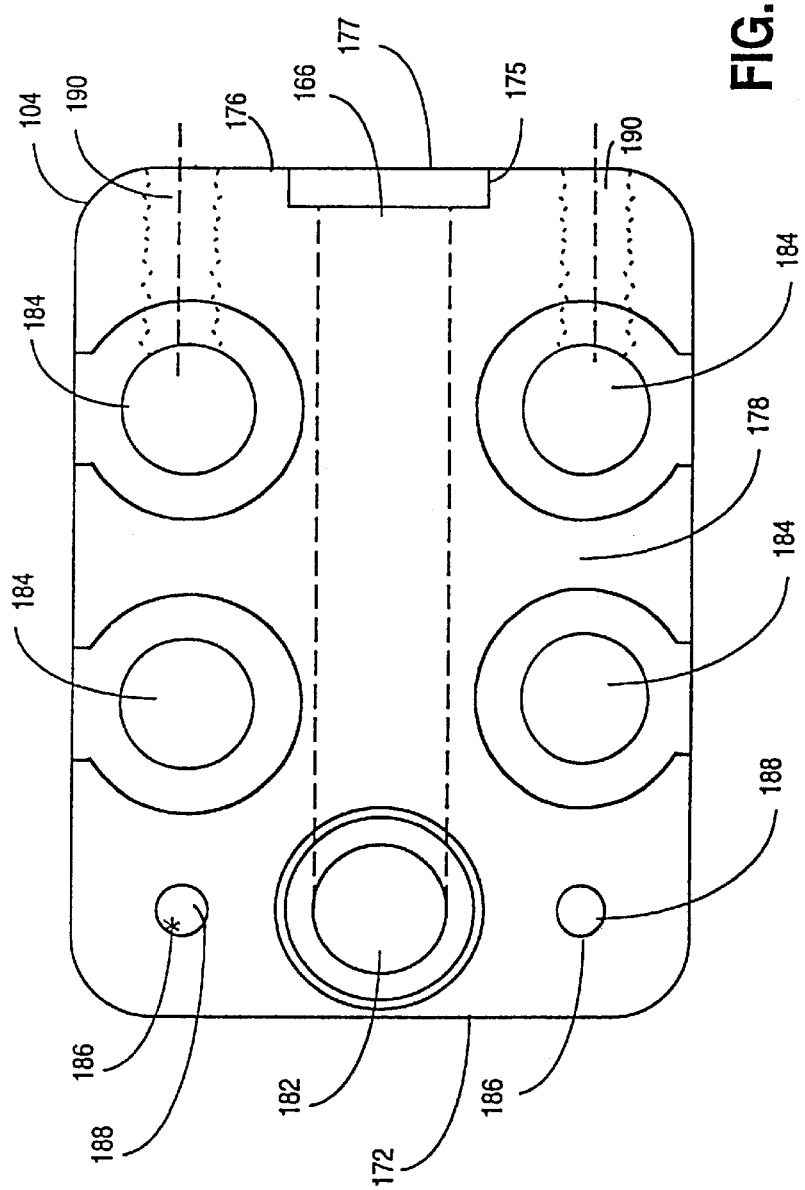
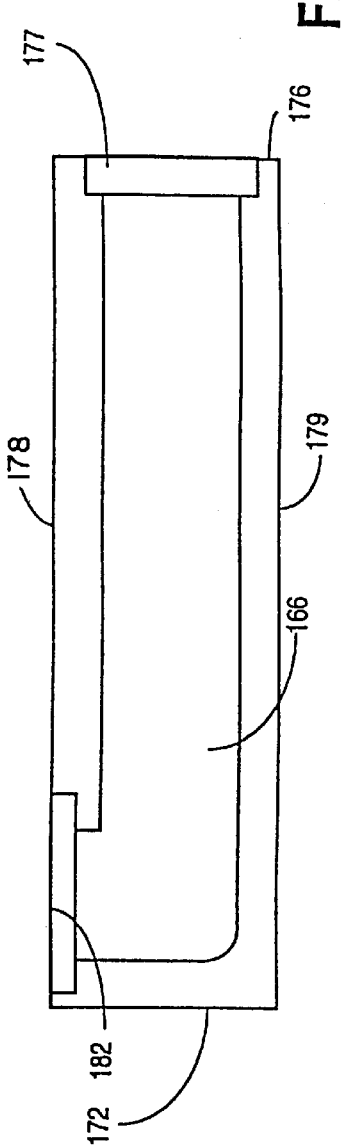
FIG. 7a
FIG. 7b

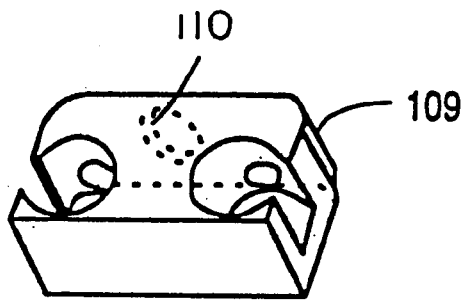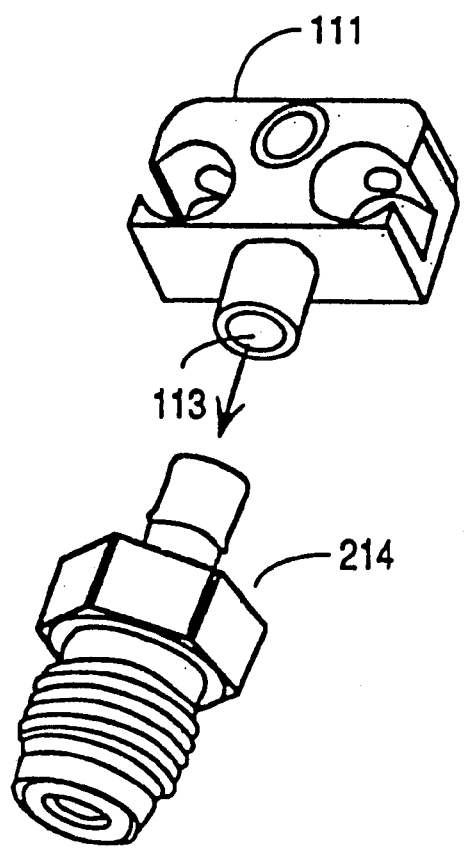
FIG. 16                                    FIG. 17

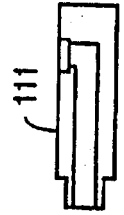
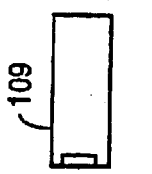
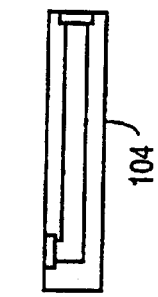
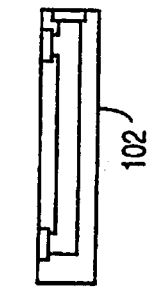
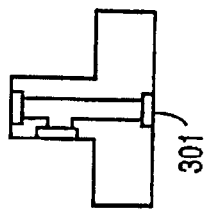
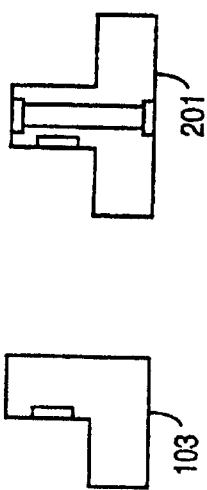
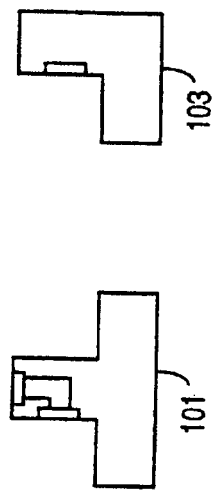
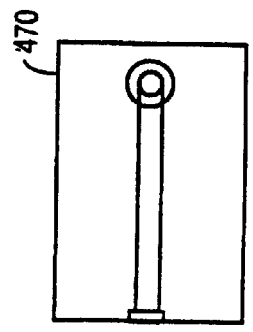
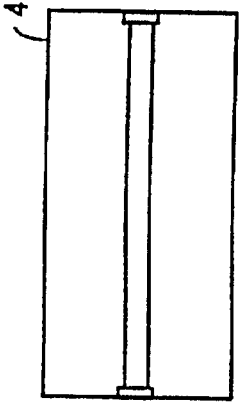
FIG. 22

SYSTEM OF MODULAR SUBSTRATES FOR ENABLING THE DISTRIBUTION OF PROCESS FLUIDS THROUGH REMOVABLE COMPONENTS

BACKGROUND OF THE INVENTION

1. Field of the Invention

The present invention is directed to a modular system for enabling a distribution of fluids, and more particularly to a system that enables a distribution of gases in a semiconductor manufacturing environment.

2. Description of Related Art

Fluid transfer panels are used to control the flow of fluids and fluid mixtures in many manufacturing processes and machinery. In the area of semiconductor manufacturing, wafer fabrication facilities are commonly organized to include areas in which chemical vapor deposition, plasma deposition, plasma etching, sputtering and the like are carried out. In order to carry out these processes, it is necessary for the tools and machines that are used for the processes to be provided with a precise amount of processing gases to enable the fabrication steps. In a typical wafer processing facility, inert and reactant gases are stored in tanks which may be located a distance from the wafer processing area and are connected via piping or conduit ultimately to a gas panel. The gas panel has the purpose of delivering precisely metered amounts of pure inert or reactant gas. A typical gas panel includes a plurality of gas paths having connected therein literally hundreds of components, such as valves, filters, flow regulators, pressure regulators, pressure transducers, and connections, connected together by tens (or hundreds) of feet of tubing. Gas panels are designed to provide desired functions, such as gas transport, mixing and purging, by uniquely configuring the various individual components.

The gas panel occupies a relatively large amount of space, as each of the components are plumbed into the gas panel, either through welding tubing to the devices or combinations of welds and connectors.

Gas panels are difficult to manufacture and hence expensive. Welds are relatively expensive to make in such systems as they must take place in an inert atmosphere. The surfaces of the gas handling system that contact gas must be made as smooth and nonreactive as possible in order to reduce the number of sites where contaminants may tend to deposit in the tube, leading to the formation of particulates or dust which could contaminate the wafers being processed.

Additional problems with the conventional gas panels relate to the fact that such a welded system of the type currently used today requires a significant amount of space between each of the components so that during servicing the connections can be accessed and opened. In addition, in order to remove a section or portion of a contemporary gas panel, many of the supports of the surrounding parts must be loosened so that the hardware can be spread out to allow removal of the item under consideration.

SUMMARY

A fluid panel subassembly comprising: a component; a substrate seal, a body, and an insert; wherein the body is fastened to the insert to form a substrate with the substrate seal therein, and the component is fastened to the body such that, the component is positioned over the substrate seal.

BRIEF DESCRIPTION OF THE DRAWINGS

FIG. 7a is a top view of a single-branch insert;

FIG. 7b is a cross-section of a single-branch insert;

FIG. 16 is an illustration of a plug insert;

FIG. 17 illustrates a tube weld insert and an inlet/outlet fitting;

FIG. 22 is an illustration of bodies & inserts;

A DETAILED DESCRIPTION OF A PREFERRED EMBODIMENT

Modem IC chip producers have improved the efficiency of their products by processing more semiconductors on wafers of a larger diameter such as 300 mm size wafers. Such design goals, always evolving, have placed continued demands on process toolmakers to minimize the size of fabrication equipment since workspace for the process tools is at a premium. There also exists the desire to increase reliability and reduce repair time both of which will decrease downtime. The present invention relates to a subassembly of a wafer processing system, the gas delivery system. However, it should be appreciated that the present invention can be applied to a variety of uses for channeling fluids ranging from liquids to gases, including corrosive materials, and processing such over a wide range of temperatures.

Figure 1:
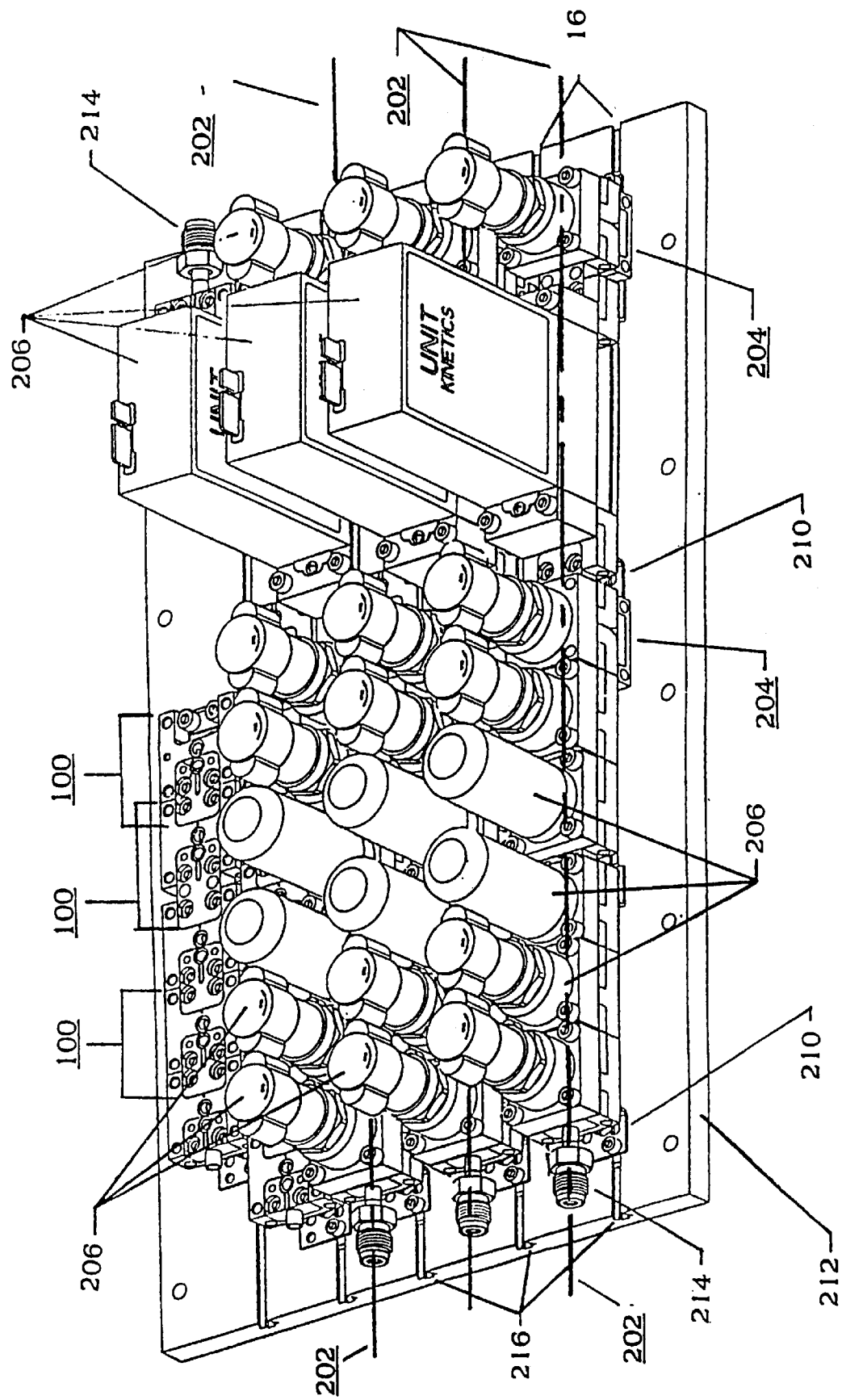
FIG. 1 is an illustration of a series of sticks on a structural support.

In a preferred embodiment, the delivery system is a gas panel assembly. This assembly begins with a gas input that passes through a series of components that regulate flow, regulate or measure pressure, add valves, and filters. Referring to FIG. 1, these components are placed in series with a variety of modular blocks pre-assembled into component substrates that connect the output of a first component to the input of a next component. This array of components and connectors is called a stick and a plurality of sticks are positioned adjacent to each other with each stick being provided a particular gas. Another series of modular substrates, known as manifold substrates connect to form manifold assemblies (manifolds) 204 and mix flow between the various sticks 202. This series of connections between components of a stick and between the plurality of sticks comprises a gas panel.

Figures 2A, 2B:
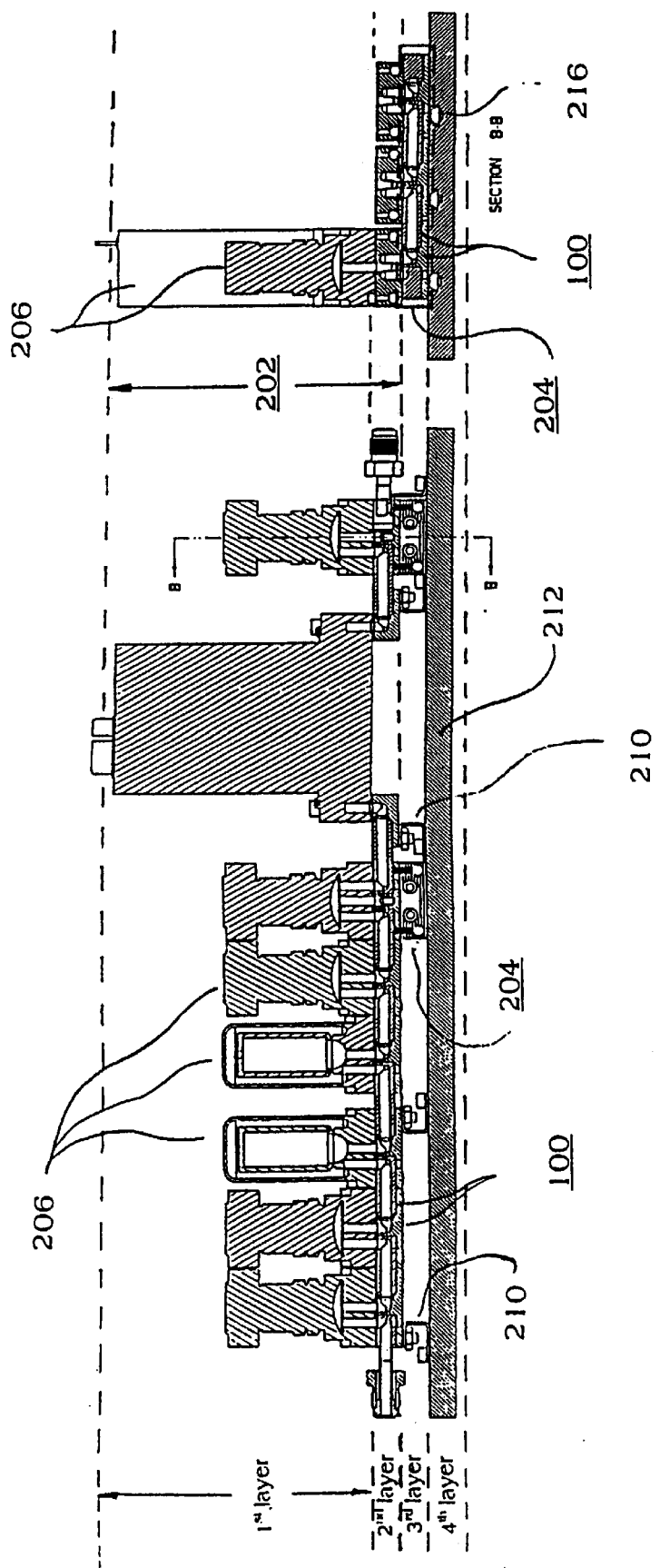
FIG. 2a is a cross-section of a stick.
FIG. 2b is an end view of a stick providing a cross-section of a manifold assembly.

Referring to FIGS. 2a and 2b, when the preferred embodiment is complete, the plurality of components, substrates, and blocks that make up a gas panel will form four layers of items. A top layer or first level is made up of the components 206 such as: filters, valves, flow regulators, pressure regulators, and pressure transducers. A second layer, the component substrate layer, is beneath the first component layer and involves a series of component substrates 100 that connect to provide flow paths to transfer gasses along a stick 202 by channeling flow in and out of each component 206. A third layer, the manifold substrate layer (manifold assembly or manifold 204), is comprised of building blocks similar to the second layer that are pre-assembled into substrates 100 and connect to transfer process gasses between sticks 202. A fourth layer is composed of a support structure for mounting the gas panel, shown here as a mounting plate 212 which is connected to the second layer through the use of brackets 210. The present invention allows for the interconnecting of channels throughout the sticks and manifolds of a gas panel through the use of a few basic modular block designs that are preassembled into substrates. These different blocks are sufficient to meet all of the flow channeling requirements necessary in the gas panel. The present invention of modular blocks or substrates allows for access to the sticks and manifolds from the convenient top side of the gas panel and the easy addition of sticks 202 to existing manifolds 204. The present invention avoids most inconvenient fastening requirements by the end user, and provides for the use of industry standard interfaces and channel sizes.

Referring back to FIG. 1, there is shown a key part to the present invention, the substrate 100, several of which are visible in two partial stick assemblies. Various types of substrates connect components 206 together (component substrates) as well as form manifold assemblies (manifold substrates) 204. Connections of substrates 100 running transverse to the sticks 202 form manifold assemblies 204 that: accept gas from a source, channel gas flow between sticks 202, or channel gas out of the sticks 202. Manifold assemblies 204 are connected to the component substrate level using different types of interconnecting blocks that can be used to make up the component substrate. In FIG. 1, a gas inlet/outlet fitting 214 is visible near an end manifold assembly 204 and a plurality of inlet/outlet fittings 214 are visible at the opposite ends of assembled sticks 202. A mid-section manifold assembly 204 is visible under one component substrate 100 as are brackets 210 attached to the component substrate level and the mounting plate 212.

Turning now to FIGS. 2a & b, there is seen a cross-section of a stick 202 with component substrates 100 connecting the gas flow outputs of a series of components 206. The third layer makes use of substrates 100 to create manifold assemblies 204 that connect transversely to second layer substrates and provide gas flow interconnections between the plurality of sticks 202. The fourth layer acts as a support structure for the other layers. For the preferred embodiment, support is provided by the mounting plate 212 which has a series of dove-tail grooves 216 (FIGS. 1 & 2b) that attach to brackets 210, the brackets 210 further fasten to the underside of the component substrates or second layer.

Figure 3:
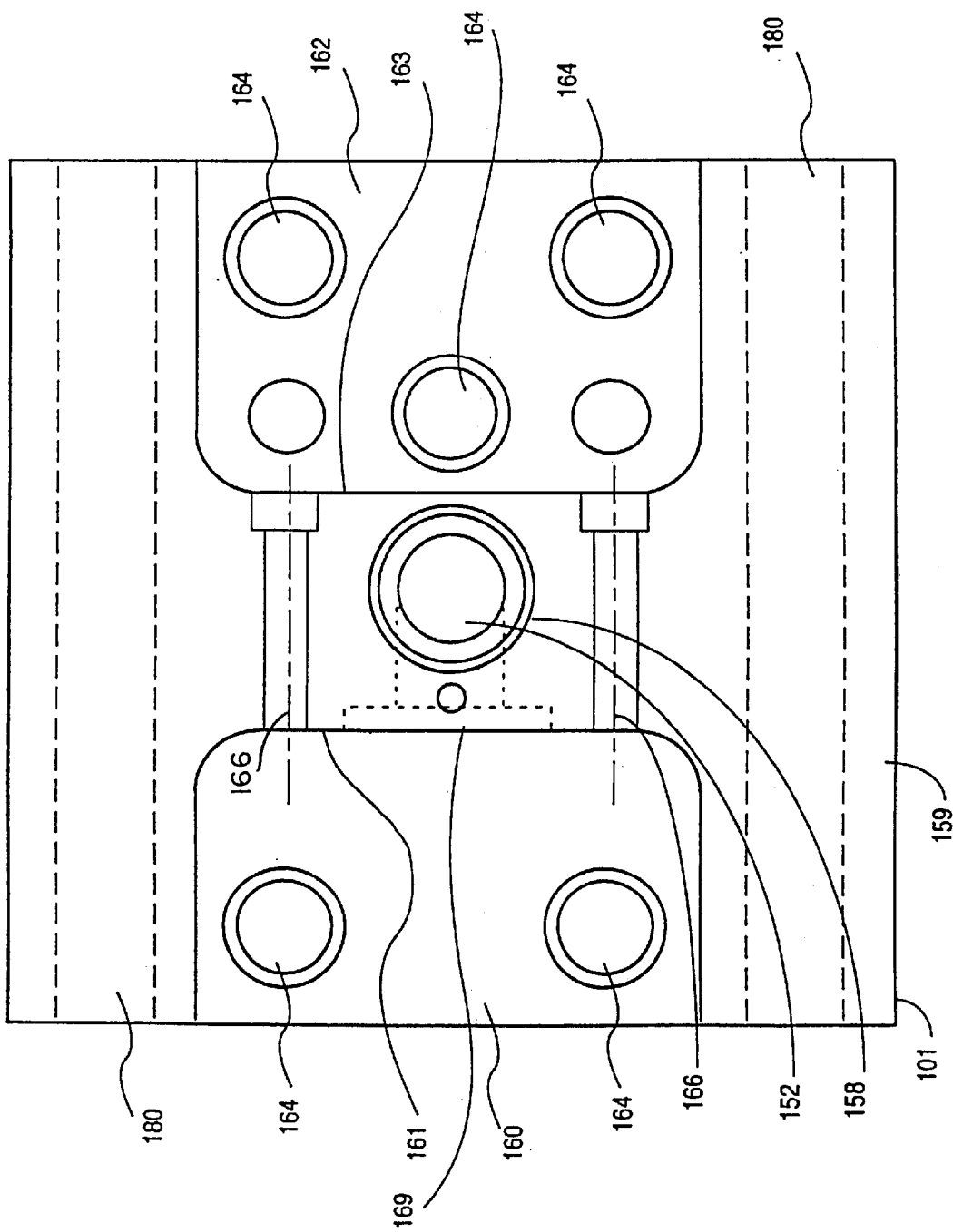
FIG. 3 is a top view of a flow-through body.
Figure 4:
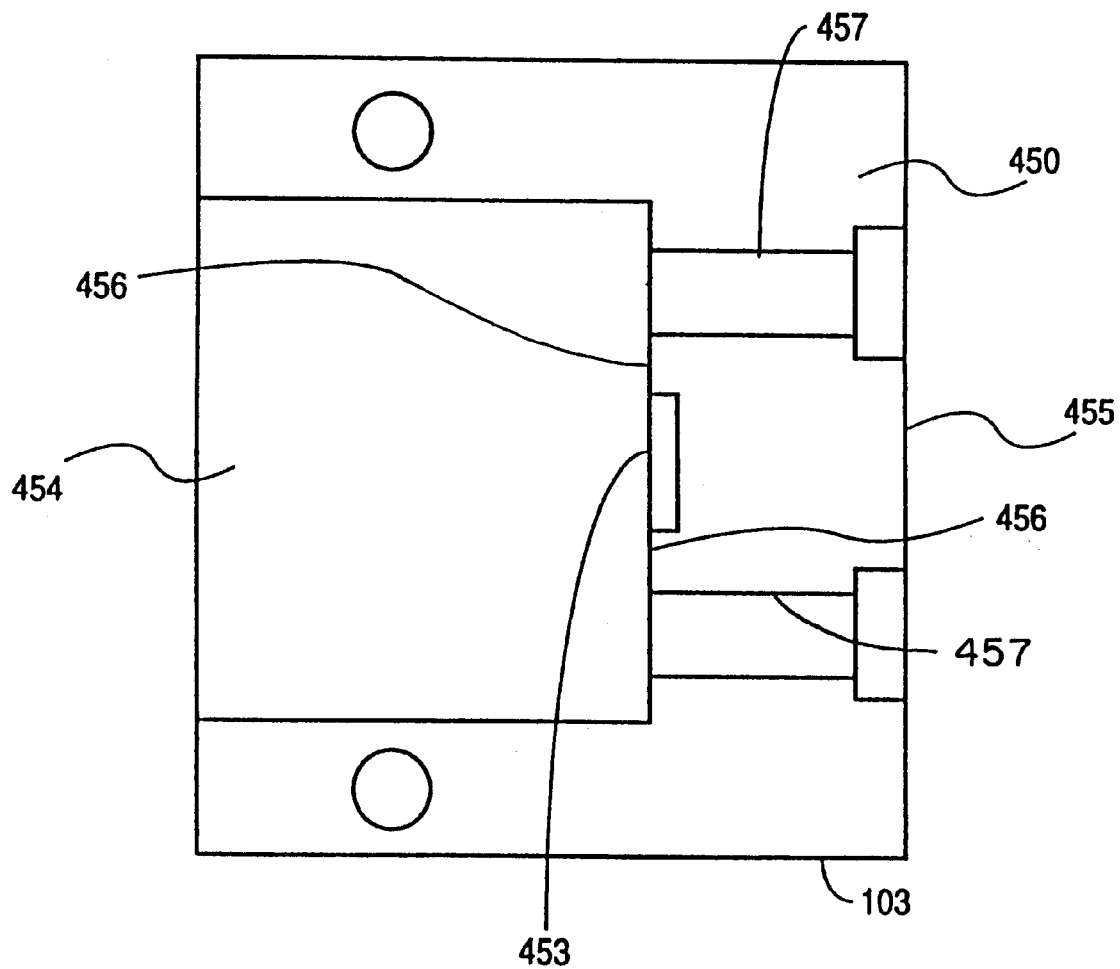
FIG. 4 is a cross-section of an MFC body.
Figure 5A:
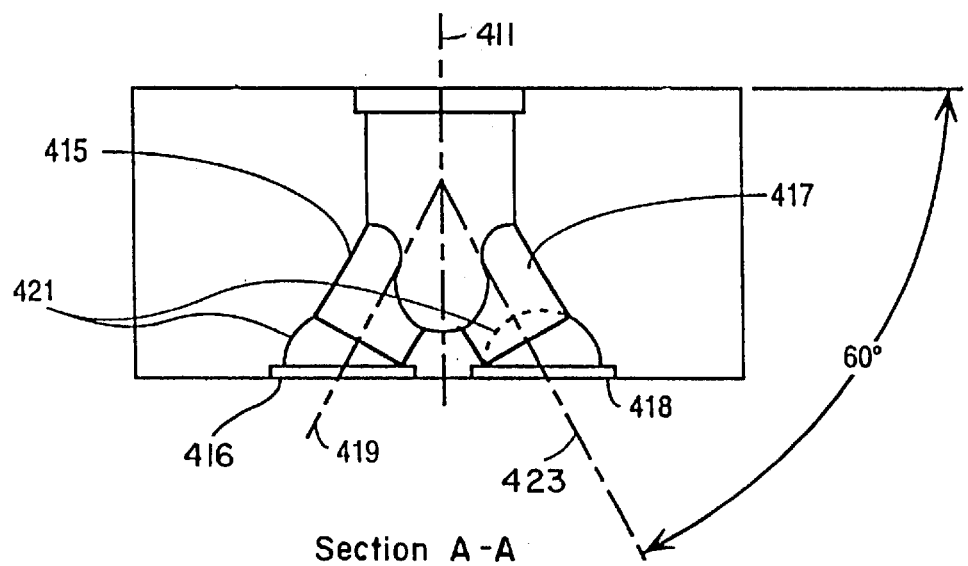
FIG. 5a is a cross-section of an interconnecting body.
Figure 5B:
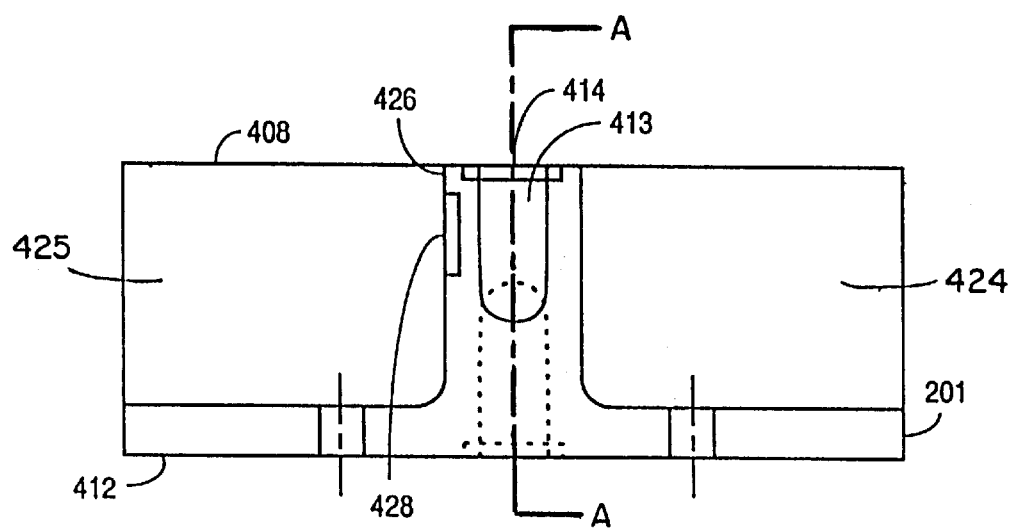
FIG. 5b is an end-view of an interconnecting body.
Figure 6A:
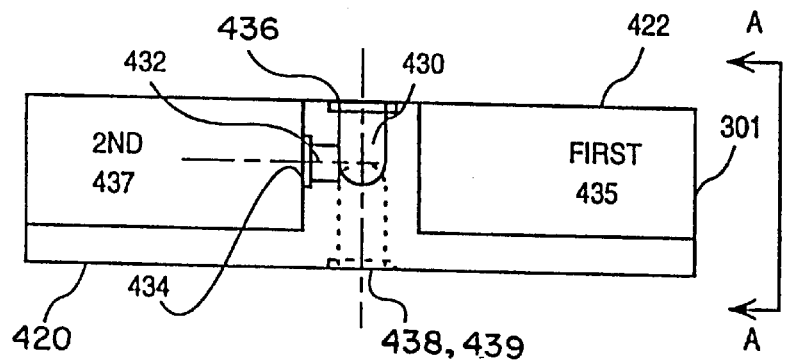
FIG. 6a is an end view of a multi-flow body.
Figure 6B:
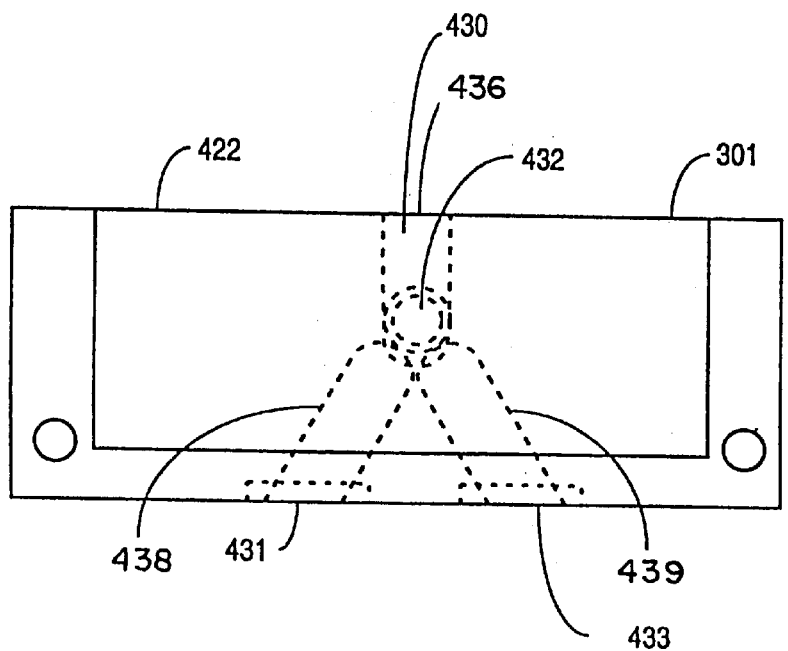
FIG. 6b is a cross-section of a multi-flow body.
Figure 8A:
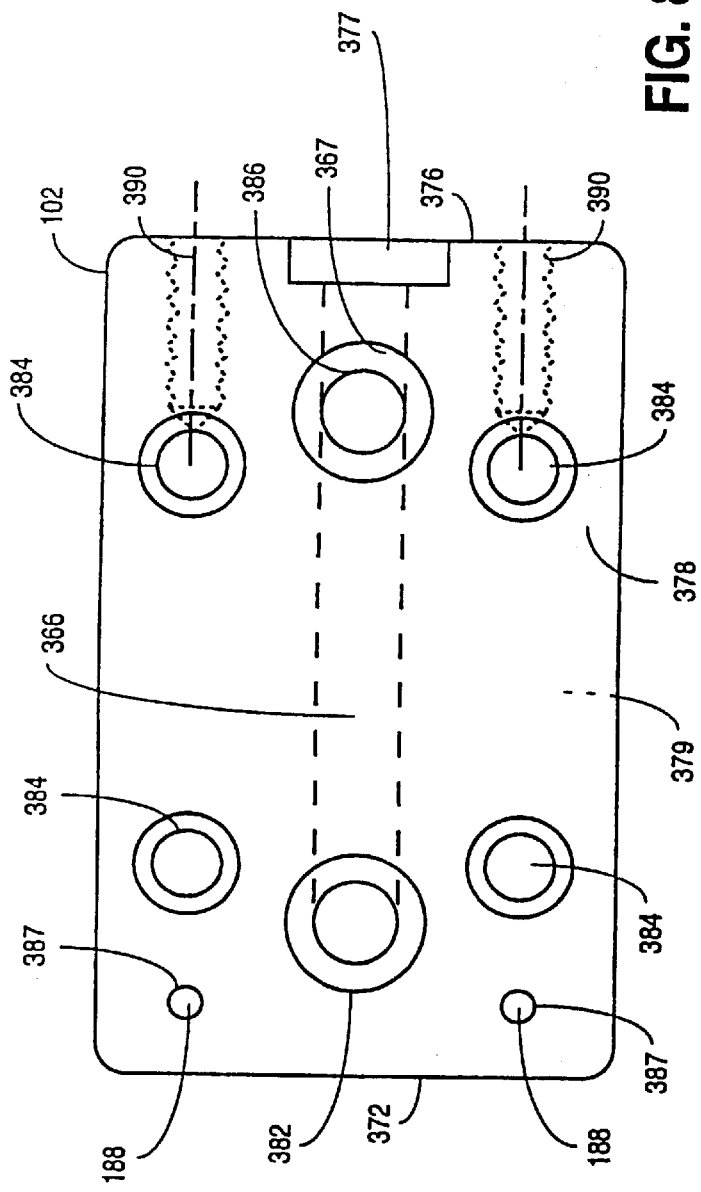
FIG. 8a is a top view of a dual-branch insert.

In the preferred embodiment, the present invention begins with a connecting block known as a body which may be one of four designs, each one channeling flow differently. Referring to FIG. 3, there is seen a top view of the first body design, a flow-through body 101 used to connect flow along a stick 202 (FIGS. 1 & 2a & b) or along a manifold assembly 204 (FIGS. 1 & 2a & b). In FIG. 4 is illustrated an MFC (mass flow controller) body 103 used to connect mass flow controllers within a stick 202. FIGS. 5a & b show another body design, an interconnecting body 201. An interconnecting body 201 connects flow between a stick 202 (FIGS. 1 & 2a & b) and a manifold 204 (FIGS. 1 & 2a & b). FIGS. 6a & b illustrate a multi-flow body 301 which both connects a stick 202 to a manifold 204 and flow along a stick 202. At the manufacturer or factory, the selected body 101, 103, 201, 301 is connected to a second type of building-block called an insert. This second building-block has two designs. The first insert design, as shown in FIGS. 7a and 7b, is a single-branch insert 104 which channels flow between a component and a body or between a stick and a manifold (either a flow-through body 101 or a multi-flow body 301). The second insert design as shown in FIGS. 8a & b is a dual-branch insert 102 that provides channeling for flow only between the components 206.

Returning to FIG. 3, the flow-through body 101 has the outer geometry of a block shape that is 1.5" L (long)×1.5" W (wide)×0.5" TK (thick). The flow-through body 101 is comprised of a top surface 159 and a first undercut (slot or cutout) 160 having a first back face 161 and a second undercut (slot) 162 having a second back face 163. Both undercuts (slots) 160, 162 are 0.5" L×0.9" W×0.38" DP. A 0.180" diameter (dia.) channel 152 is machined beginning at a first port 158 at the top surface 159 and transitions a net 90 degrees to a second port 169 at the first back face 161. Both ports 158, 169 are counterbored 0.29" dia.×0.24" DP. The flow-through body 101 has 4×0.190" dia.×0.26" DP threaded through holes (not shown). The first undercut 160 has 2×0.190" dia. threaded through holes 164. The first back face 161 has 2×0.170" dia. through holes 166 to the second back face 163. The channel 152 at the second port 169 is located equidistant between the two through holes 166. At the second back face 163, each through hole 166 is counterbored 0.28" dia.×0.21" DP. In the second undercut 162 there exists 3×0.190" dia. threaded through holes 164. Running the length of either side of the body are 2×0.1875" dia. through holes used as heater channels 180.

The MFC body 103 is shown in FIG. 4. The MFC body 103 has an outer shape of 0.95" L×1.5" W×0.50" TK. There is a top surface 450 and a cutout 454 with a backface 456. The undercut has the dimensions of 0.5" L×0.9" W×0.38" DP. A counterbore 453 exists in the back face 456 that is 0.29" dia.×0.021 DP. Equidistant about the counterbore 453 are 2×0.170" dia. through holes 457 that start at a first end 455 and run out at the backface 456. The two holes 457 are counterbored 0.28" dia.×0.16" DP at the first end 455.

Referring now to figures 5a & b, there is illustrated the interconnecting body 201, used to connect flow between the manifold assemblies 204 and the sticks 202 (FIGS. 1 & 2a & b). The interconnecting body 201 has an outer geometry in a block shape that is 1.5" L×1.5" W×0.5" TK. The interconnecting body 201 has a top surface 408 and a bottom surface 412. The top surface 408 has a 0.180" dia.×0.33" DP top channel 413 that exists at a port 414, the top channel 413 is normal to the top surface 408. The top surface 408 is flat and forms a plane. The interconnecting body 201 has 2×0.156" dia. through bottom channels 415, 417 with centerlines 419, 423 that exit at a bottom surface 412 at ports 416, 417. The two bottom channels 415, 417 are angled 60 degrees relative to the top surface 408 and counterbored 0.29" dia.×0.024" DP at the bottom surface 412. The two bottom channels 415, 417 each includes a hemisphere 0.09" R (radius) 421 drilled within the port; 416, 418. The two bottom channel centerlines 419, 423 are spaced 0.30" apart at the bottom surface. Top surface 408 and bottom surface 412 are parallel to each other. The two ports 416, 418 at the bottom surface 412 are positioned equidistant about the top channel 413 centerline 411. The two bottom channels 415, 417 intersect the top channel 413 in mid-body 201. The interconnecting body 201 has a first undercut 424 and a second undercut 425. Both undercuts 424,425 are 0.5" L×0.9" W×0.38" DP. The second undercut 425 has a backface 426 with a 0.29 dia.×0.024 DP counterbore 428.

Referring now in FIGS. 6a & b, there is illustrated the multi-flow body 301 used to connect flow both along the sticks 202 and between the manifold assemblies 204 and the sticks 202 (FIGS. 1 & 2a & b). The multi-flow body 301 has an outer geometry in a block shape that is 1.5" L (long)×1.5" W (wide)×0.5" TK. The multi-flow body 301 has a top surface 422 and a bottom surface 420. A 0.180" diameter top channel 430 with a 0.29 dia.×0.024 DP counterbore, begins at a top port 436 that is centered in the top surface 422, 2×0.180" bottom channels 438, 439 each having 0.29" dia.×0.024" DP counterbores, exist at two bottom ports 431, 433 located at a bottom surface 420. The two bottom channels 438, 439 intercept the top channel 430 in mid-block 301. The multi-flow body 301 has a first undercut 435 and a second undercut 437. Both undercuts 435,437 are 0.5" L×0.9 W×0.38" DP. A 0.180" diameter channel 432 counterbored 0.29 dia.×0.030" DP begins at a port 434 of the second undercut 437, is normal to, and intersects channel 430 in mid-body 301.

Turning now to FIG. 7a there is seen a top view, and FIG. 7b a cross-section, of a single-branch insert 104. The single-branch insert 104 has the outer dimensions of a rectangular block, 1.4" L×0.875" W×0.375" TK. The single-branch insert 104 has a first end 176 which is later fastened to an undercut of one of the four bodies 101, 103, 201, 301 (FIGS. 3, 4, 5a & b, 6a & b) at the factory, and a second end 172 which is fastened to an undercut of a different substrate at final assembly. The single-branch insert 104 has a top surface 178 and a bottom surface 179. The single-branch insert 104 has a 0.180" dia. channel 166 therein, the channel 166 begins at a first port 177 located at the insert first end 176. The channel 166 runs the length of the single branch insert 104 to a second port 182 located on the top surface 178. First port 177 having a 0.29" dia.×0.0301"DP counterbore 175, and the second port 182 having a 0.29" dia.×0.024" DP counterbore. The channel 166 completes a net or resultant 90-degree turn between the ports 177 & 182. The single-branch insert 104 includes 4×0.190" dia. through holes 184 counterbored 0.33 dia.×0.20" DP. On opposite sides of the second port 182 are 2×0.12" dia. through holes 186. Two stainless steel pins 188, each 0.120/0.121" dia.× 0.38" L are press-fit into the holes 186 such that 0.12" of the pins 188 extend out of the single-branch insert 104 bottom surface 179. Two (2)×0.160" dia. threaded holes 190 exist equidistant about the first port 177 at the first end 176.

Figure 8B:
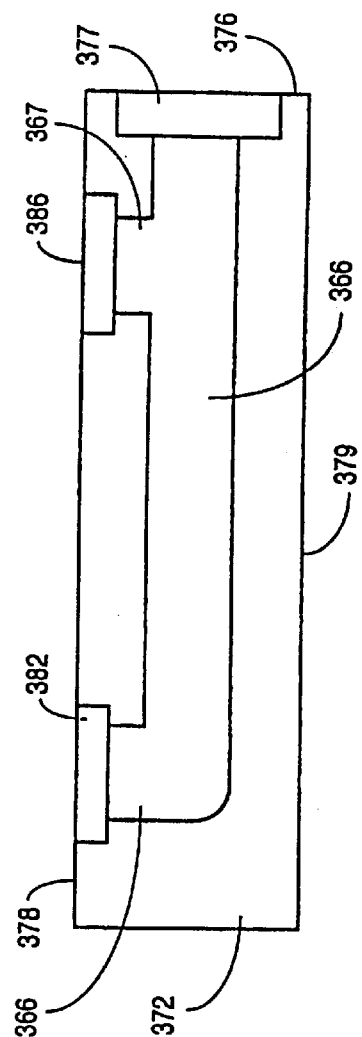
FIG. 8b is a cross-section of a dual-branch insert.

Turning now to FIG. 8a there is seen a top view, and FIG. 8b a cross-section, of a dual-branch insert 102. The dual-branch insert 102 has a first end 376 which is later fastened to an undercut of one of the four bodies 101, 103, 201, 301 (FIGS. 3, 4, 5a & b, 6a & b) at the factory, and a second end 372 which is fastened to an undercut of a different substrate at final assembly. The dual-branch insert 102 has the outer dimensions of a rectangular block, 1.4" L×0.875" W×0.375" TK. The dual-branch insert 102 has a top surface 378 and a bottom surface 379. The dual-branch insert 102 has a 0.180" dia. first channel 366 therein, the first channel 366 begins at a first port 377 located at the insert first end 376 and includes a counterbore 0.29" dia.×0.021 DP. The first channel 366 runs the length of the dual-branch insert 102 to a second port 382 located on the top surface 378. The second port 382 has a 0.29" dia.×0.024" DP counterbore. The first channel 366 completes a net or resultant 90-degree turn between the ports 377, 382. The dual-branch insert 102 includes 4×0.190" dia. through holes 384 counterbored 0.33" dia.×0.20" DP. Equidistant about the second port 382 are 2×0.12" dia. through holes 387. Two stainless steel pins 188, each 0.120/0.121" dia.×0.38" L are press-fit into the holes 387 such that 0.12" of the pins 188 extend out of the insert bottom surface 379. Two×0.164" dia. threaded holes 390 exist equidistant about the first port 377 at the first end 376. Beginning at the top surface 378, near the first end 376, is a second channel 367 having a third port 386 which is counterbored 0.29" dia.× 0.024" DP. This channel is normal to the top surface 378 and intersects the first channel 366 in mid-body 102.

The present invention constructs substrates from two buildingblocks, the body 101, 103, 201, 301 and the insert 104, 102. Through body 101, 103, 201, 301 and Insert 102, 104 selection, channeling can be provided to direct gas flow a variety of ways through the substrate. Tie assembly of the first substrate 100 will be described in detail but it is to be understood that other substrates discussed later use the same assembly procedures and fasteners as the first substrate 100, and have common mating features to the insert, the body, and the seal (discussed later) within.

Figure 9A:
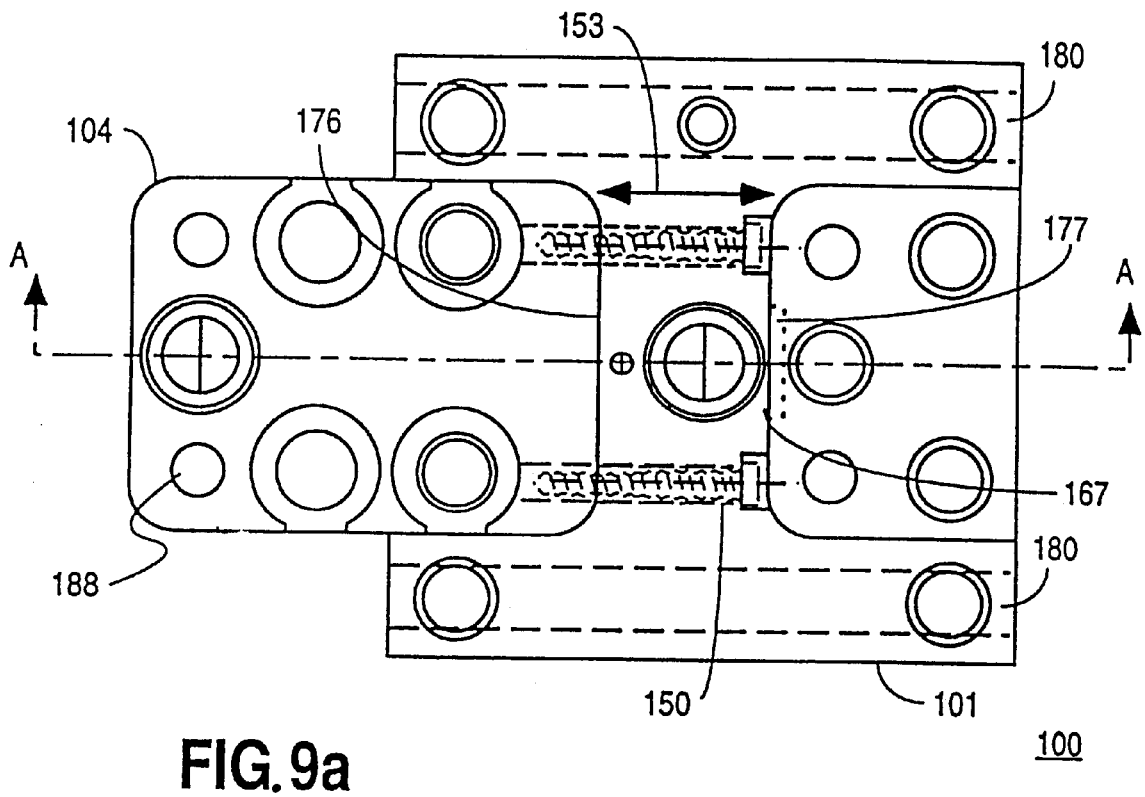
FIG. 9a is a top view of a first substrate.
Figure 9B:
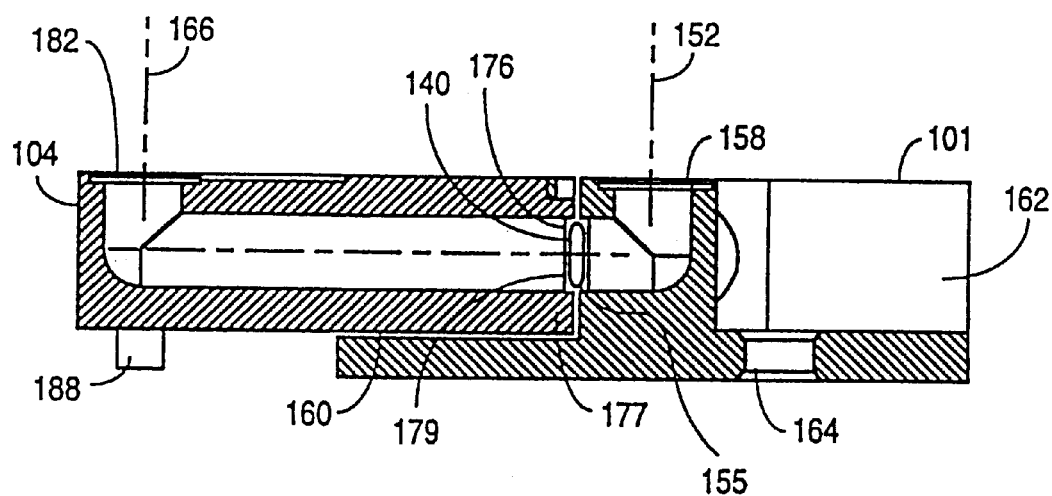
FIG. 9b is a cross-section of a first substrate.

Provided in FIG. 9a is a top view and FIG. 9b a cross-section showing the first type of substrate assembly or first substrate 100. A flow-through body 101 (FIG. 3) is connected to a single-branch insert 104 (FIGS. 7a & b), to form the first substrate 100 which makes up portions of the second and third layers for interconnecting process gasses. This first substrate 100 may be used within a component substrate in which the flow-through body 101 has a set of hole patterns to connect to components 206 above or brackets 216 below. Alternatively, this first substrate 100 may be used in a manifold assembly 204 (FIGS. 1 & 2a & b) using a flow-through body 101 which has a different set of hole patterns for connecting to component substrates above. The first substrate 100, when connected to a gas panel system, will channel flow in a direction along a stick 202 or manifold assembly 204 (FIGS. 1 & 2a, b).

The first substrate 100, assembled from the flow-through body 101 and the single-branch insert 104, includes a metallic seal 155 at a common mating surface. This metallic seal 155 (FIG. 9b) is crush seated at assembly. The first substrate 100, as with all substrate designs, is assembled by the manufacturer at the factory, the substrates are not intended for disassembly by unauthorized personnel, and the seal 155 is known as a factory seal. The selected body, here a flow-through body 101, and the single-branch insert 104 are connected using threaded fasteners 150, which provide a clamping force 153 (FIG. 9a) to crush-seat and maintain the metal seal 155 in position. The flow-through body 101 has undercuts 160, 162 (FIG. 3a) for mating with or receiving the ends of single-branch inserts 104. One such single-branch insert 104 will be assembled to the flow-through body 101 undercut 160 with fasteners 150 at the factory and includes the factory seal 155. The other undercut 162 will connect to an insert 102, 104 of another substrate during assembly of a stick 202 (FIGS. 1 & 2a, b) or manifold assembly 204 (FIGS. 1 & 2a, b) by the end user.

The substrate 100 is assembled by fastening the flow-through body first undercut 160 to an insert first end 176. Within the substrate 100, between the flow-through body second port 169 common to the single-branch insert first port 177, is the factory seal 155. The seal 155 is maintained in a seal joint 140 provided by a gap 140 between the flow-through body second port 169 counterbore and the insert first port 177 counterbore, the gap 140 being created when the flow-through body 101 and the single-branch insert 104 are assembled. As shown in FIG. 9b the combined flow-through body channel 152 and single-branch insert channel 166 provide a fluid flow path that transitions a net or resultant 180-degrees between the flow-through body first port 158 and the single-branch insert second port 182. Once the substrate 100 is assembled with fasteners 150, the factory seal 155 will be maintained between the flow-through body 101 and the single-branch insert 104.

Figure 10:
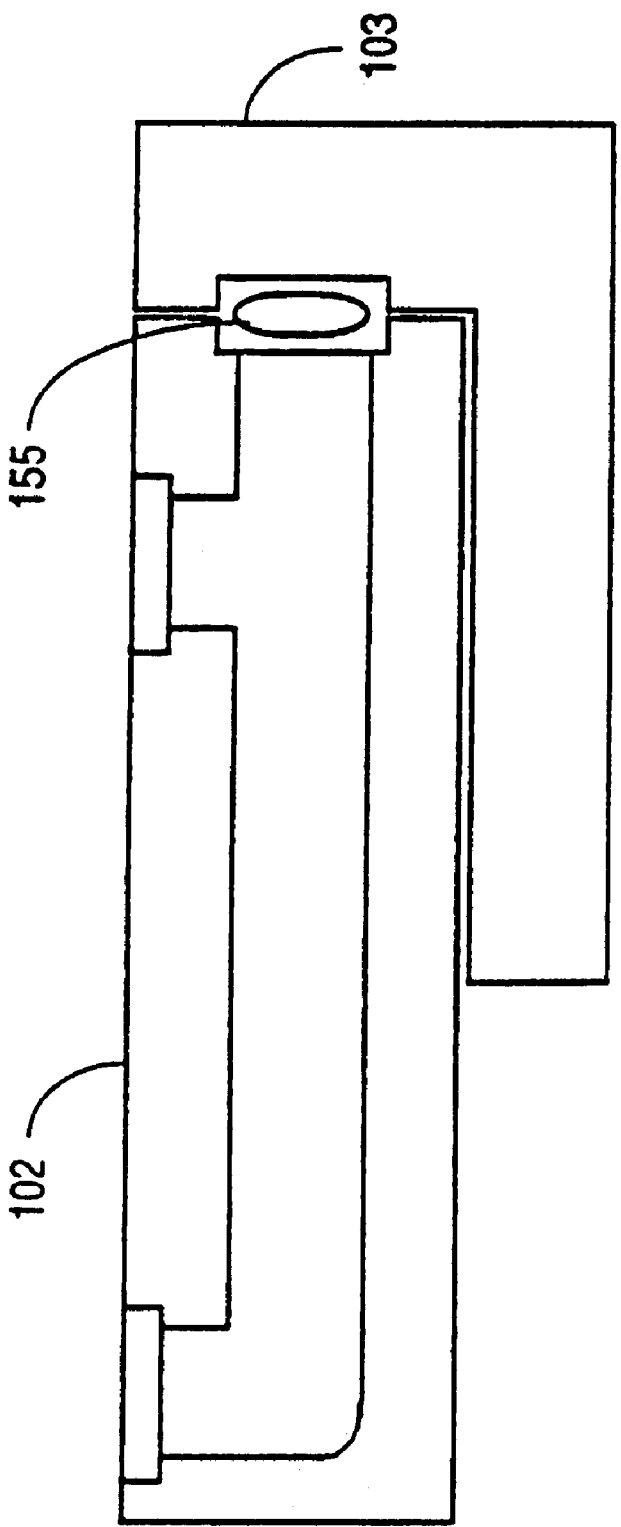
FIG. 10 is an illustration of an MFC substrate.

Turning to FIG. 10, there is shown an MFC substrate 50. The MFC substrate 50 is assembled from an MFC body 103 (FIG. 4 [3b]), a single-branch insert 104 (FIG. 7) or as shown a dual-branch insert 102 (FIG. 8), and a seal 155. The MFC substrate 50 is used to connect MFCs 206 into a stick assembly 202 (FIGS. 1 & 2a, b).

Figure 11A:
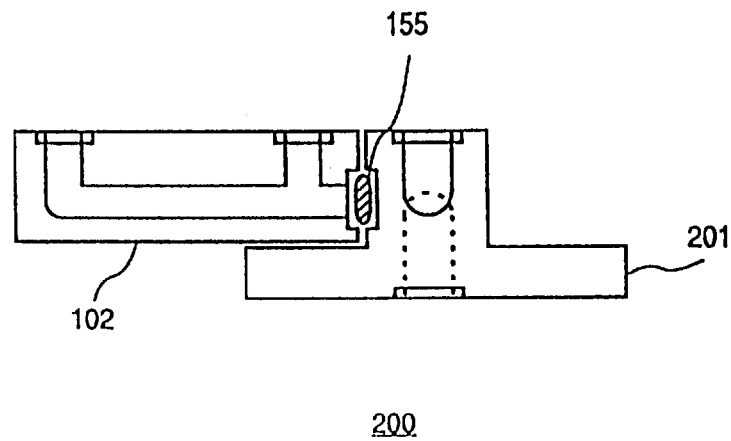
FIG. 11a is a cross-section of a second substrate.

FIG. 11 a illustrates the second substrate 200 which is assembled from an interconnecting body 201 (FIG. 5a & b) and a dual-branch insert 102 (FIGS. 8a, b). The second substrate 200 passes bidirectional fluid flow from: the manifold 204—through the interconnecting body 201—to a component (such as a valve) 206—through the dual-branch insert 102—and along the stick 202 (FIGS. 1 & 2a, b). The second substrate 200 does not have a channel which connects flow directly between the interconnecting body 201 to the dual-branch insert 102. Instead flow between the interconnecting body 201 (FIG. 11a) and the dual-branch insert 102 is only available through the component 206. The interconnecting body 201 and the dual-branch insert 102 have the seal 155 installed within their common counterbores. When the component, here a valve, 206 is closed, flow is blocked between the stick 202 (FIGS. 1 & 2a, b) and the manifold assembly 204 (FIGS. 1 & 2a, b).

Figure 11B:
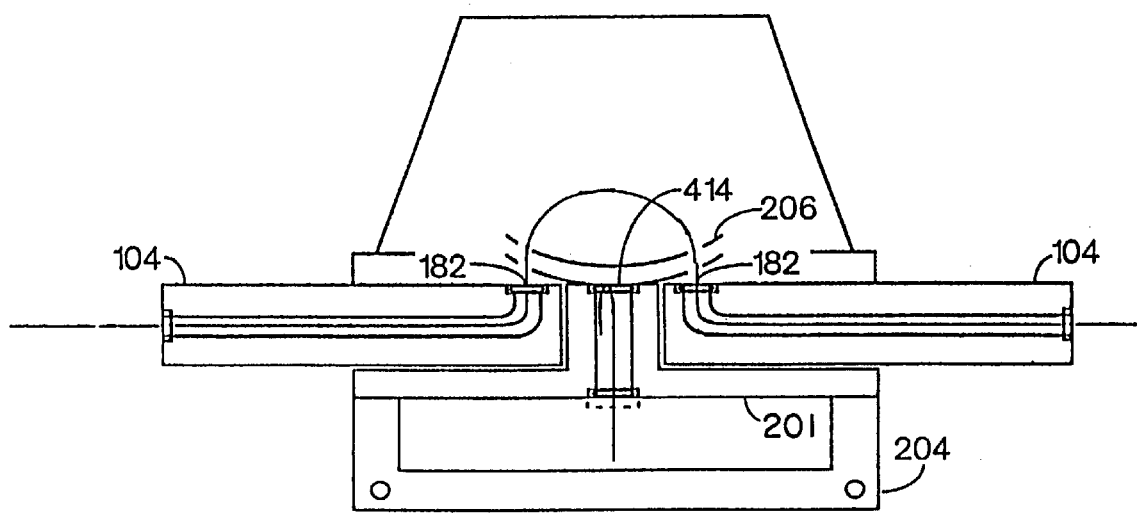
FIG. 11b is an illustration of a second substrate with a closed valve.
Figure 11C:
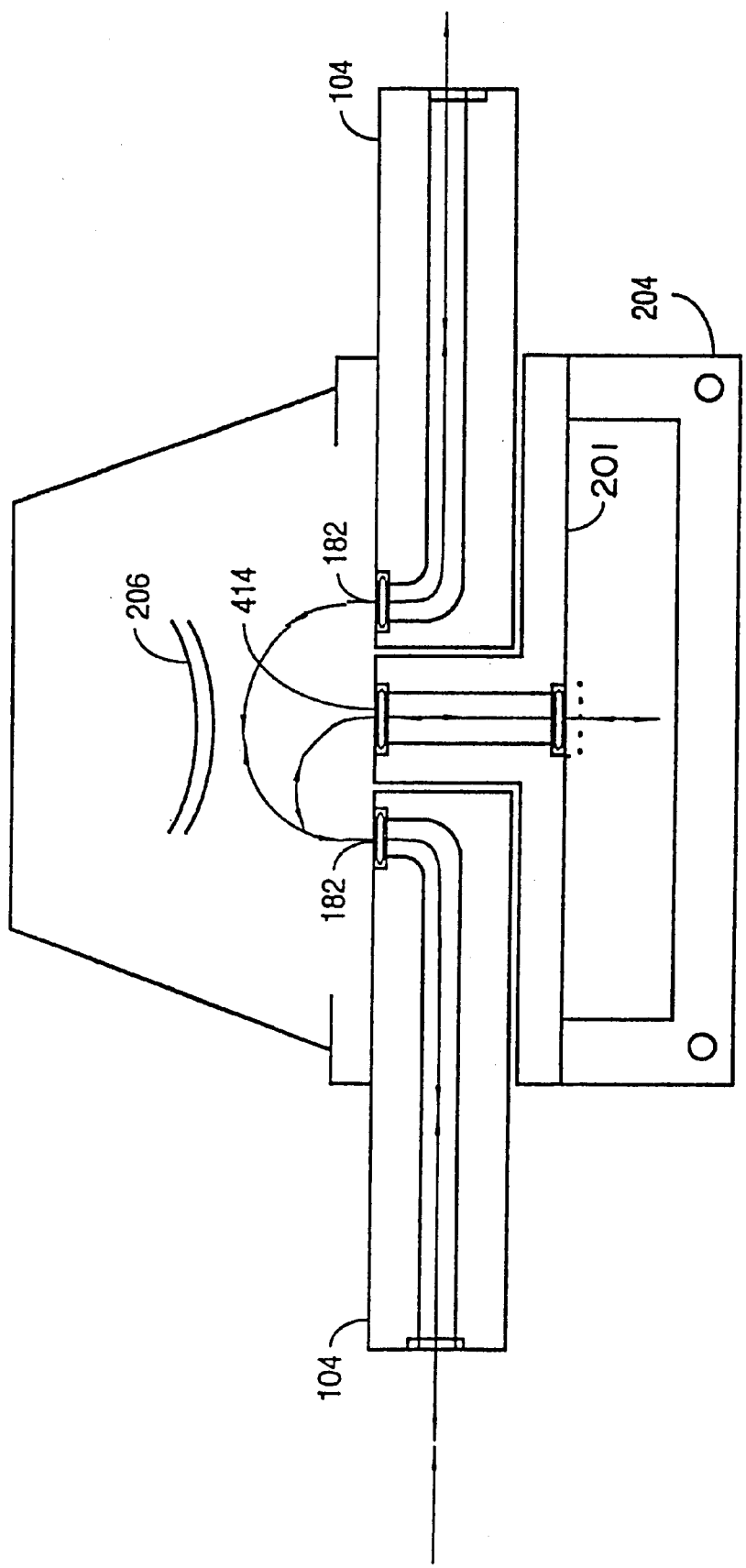
FIG. 11c is an illustration of a second substrate with an open valve.

Turning now to FIGS. 11b & c is shown an alternate use of the interconnecting body 201 which does not use a factory seal. With this construction, for use in the second level, the interconnecting body 201 is assembled to two single-branch inserts 104 (FIG. 7) of other substrates 100, 300 (FIGS. 9a, b & 12a, b provided later). Such an arrangement provides three ports 182, 414, 182 closely positioned (centerlines spaced 0.30" apart) with a component, here with FIG. 11b, a valve, 206 fastened over the ports 182, 414, 182. When the valve 206 is closed over the interconnecting body port 414, and flow is blocked from the manifold 204 (not shown), flow is still allowed through the valve 206 and along the stick 202. FIG. 11c shows the valve 206 open and flow allowed between the stick and the manifold assembly 204.

Figure 12A:
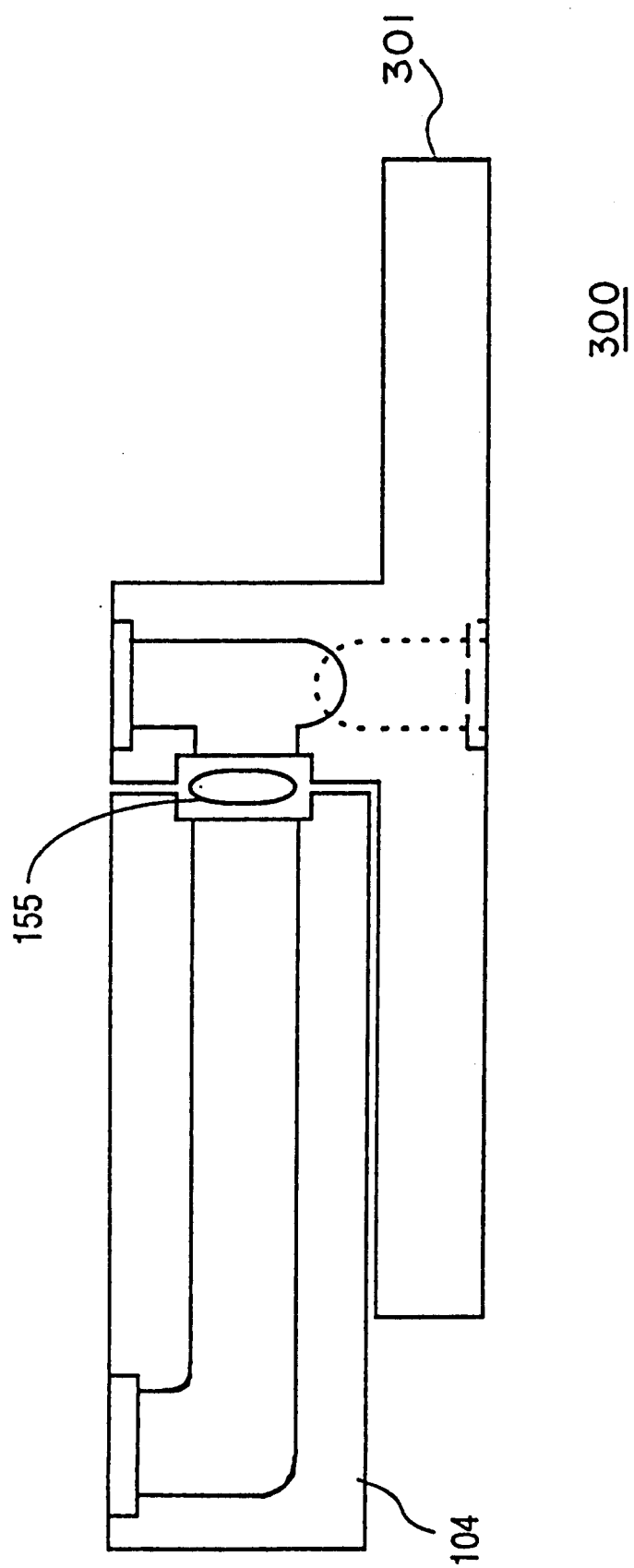
FIG. 12a is an illustration of a third substrate.
Figure 12B:
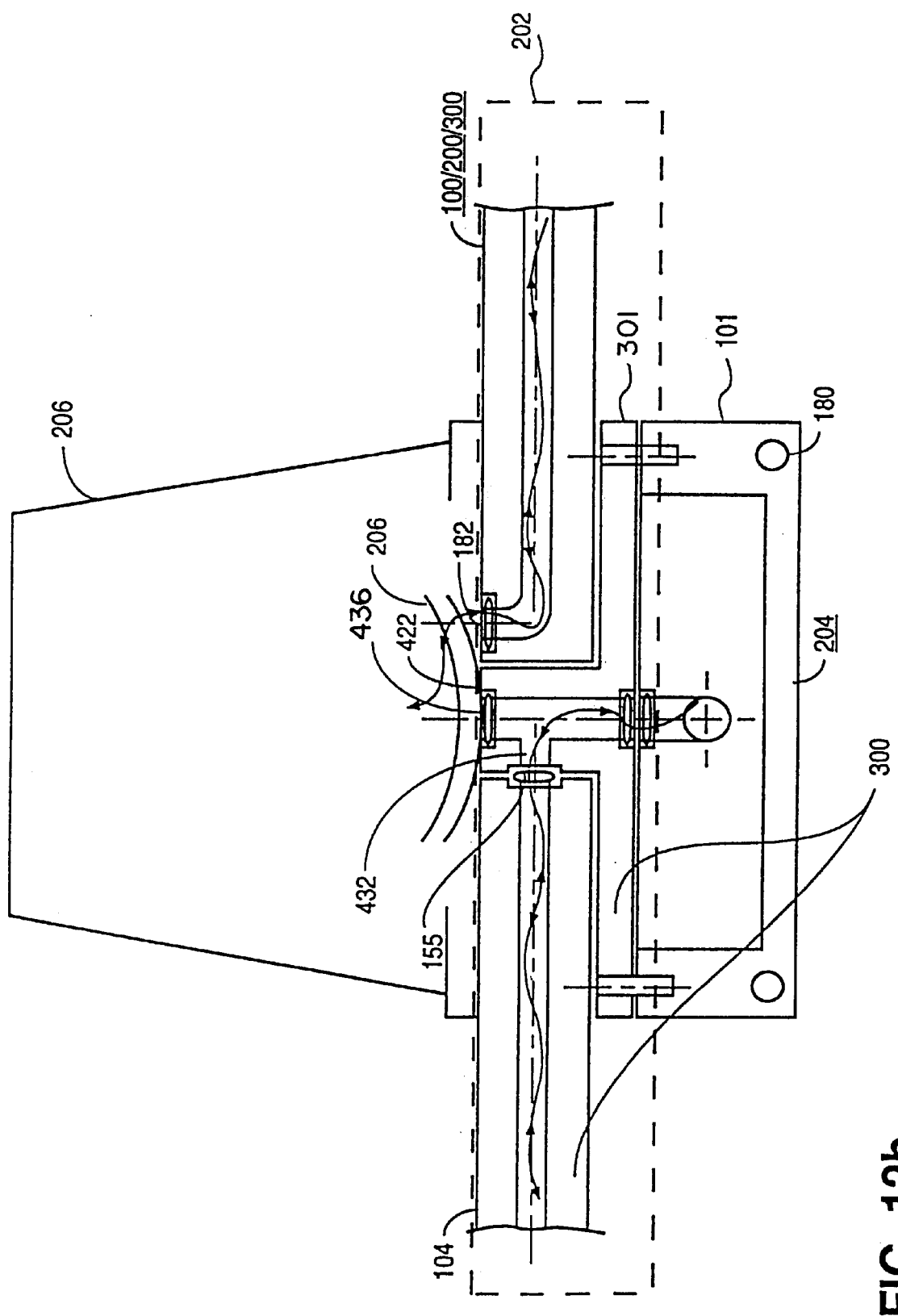
FIG. 12b is an illustration of a third substrate with a closed valve.
Figure 12C:
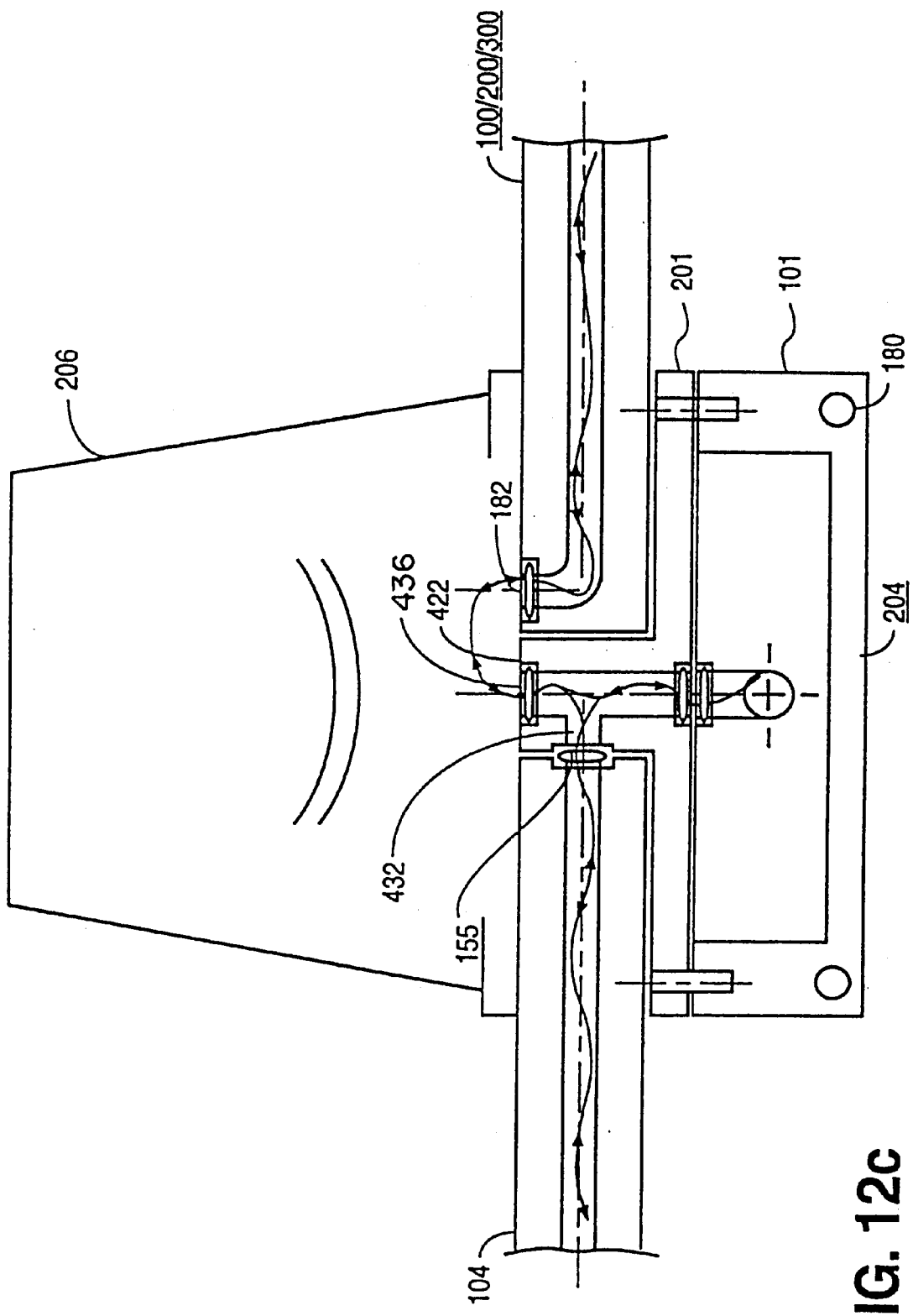
FIG. 12c is an illustration of a third substrate with an open valve.

Turning now to FIG. 12a is shown a third substrate 300 where a multi-flow body 301 is factory installed with a single-branch insert 104. This substrate 300 is used in the second level as a component substrate. In this assembly, a seal 155 and the single-branch insert first end 176 (FIGS. 8a, b) are installed into the multi-flow body 301. Turning now to FIG. 12b, centered over and fastened to the top surface 422 of the multi-flow body 301 (FIG. 6a) is a component (here a valve) 206. As shown in FIG. 12c, when the valve 206 is closed and blocks the top port 436, flow along the stick 202 (FIGS. 1 & 2a, b) is blocked at the valve 206, but flow from or to the manifold assembly 204 and a portion of the stick 202 is maintained. Gas coming to or from the manifold assembly 204, flows in or out of the stick 202 through the intersecting channel 432, the single-branch insert 104, and down a portion of the stick 202 (FIGS. 1 & 2a, b), but is blocked from the rest of the stick 202 by the valve 206. Conversely, as shown in FIG. 12b, when the valve 206 is open, flow in both directions along the stick 202 (FIGS. 1 & 2a, b) and to and from the manifold assembly 204, is allowed.

Figure 13:
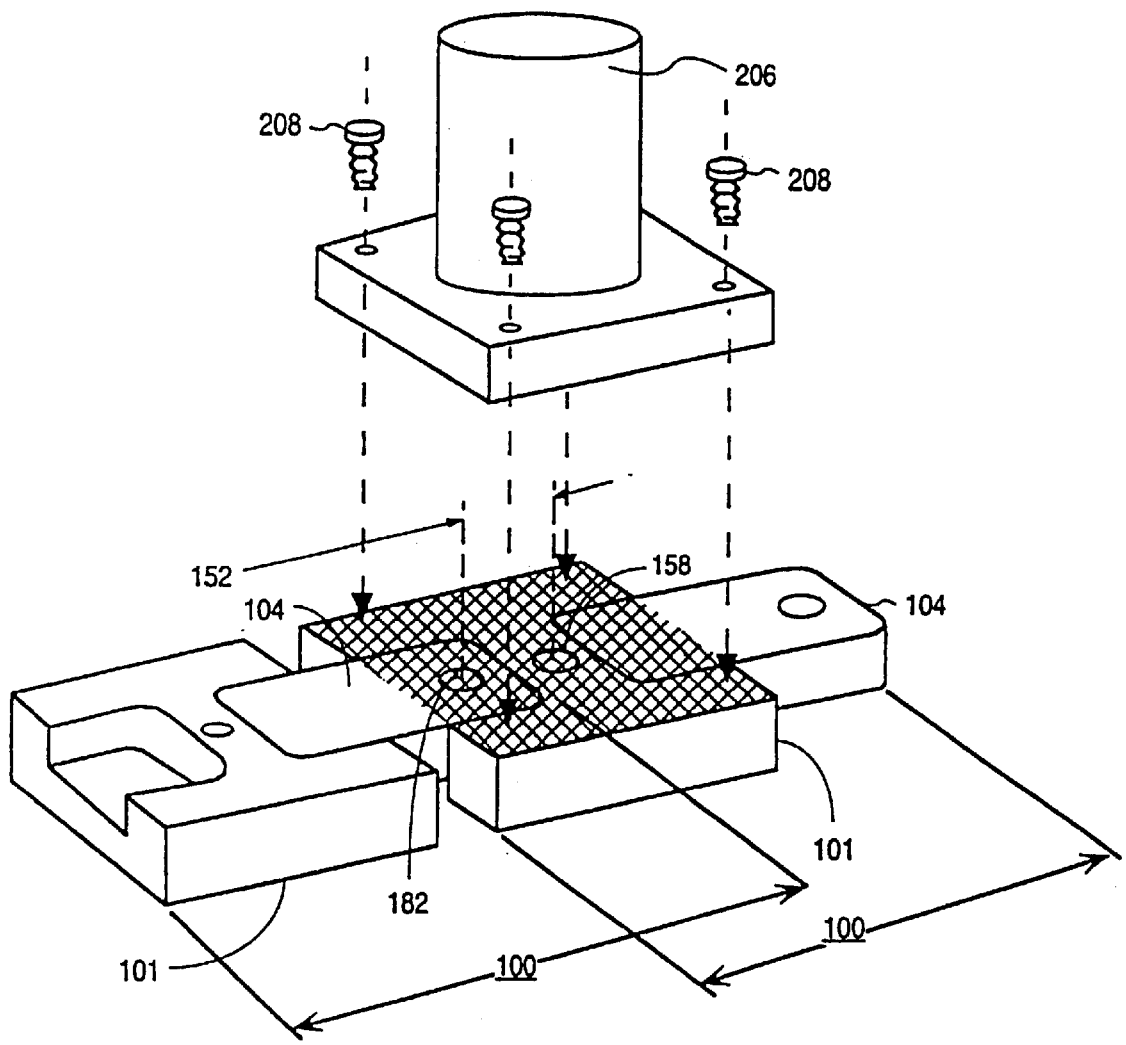
FIG. 13 is an exploded view of substrates and a component.

Turning now to FIG. 13, there is shown an exploded view of two substrates 100 connected to each other by fasteners (not shown) and a component (here a valve) 206 connected with fasteners 208 threaded to the flow-through body. Once assembled, the component 206 is positioned over the flow-through body 101 first port 158 (FIG. 3) of each substrate 100, the single-branch insert second port 182 (FIG. 7a & b) of the other substrate 100, the seal 155, the flow-through body second back face 163, and the single-branch insert first end 176 (FIG. 7a & b). In this manner, flow is provided through the component 206 by adjacent ports 158/182 spaced 152 a distance of 0.3041 between port 158,182 centerlines.

Figure 14A:
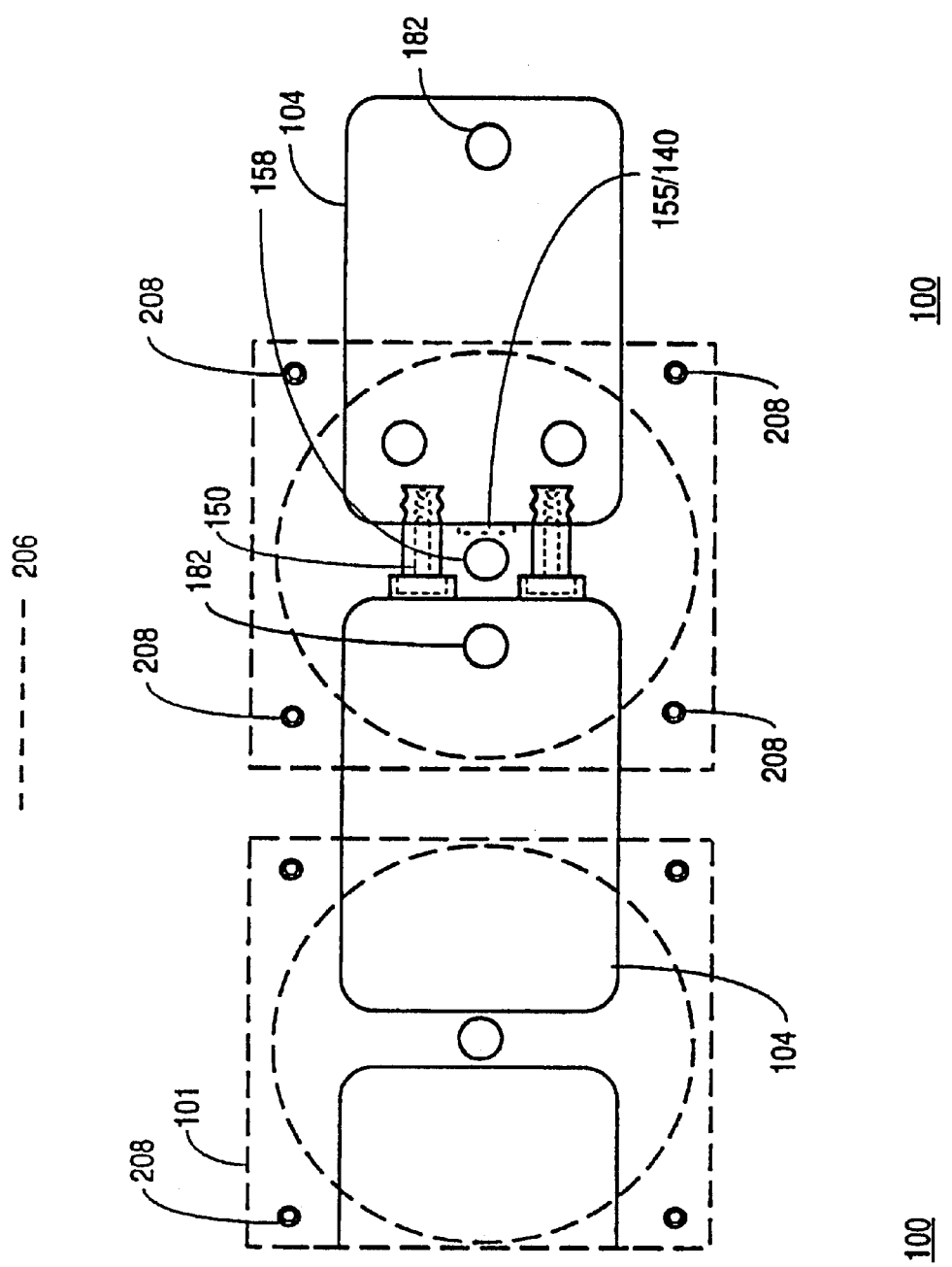
FIG. 14a is a top view of components outlined over substrates.
Figure 14B:
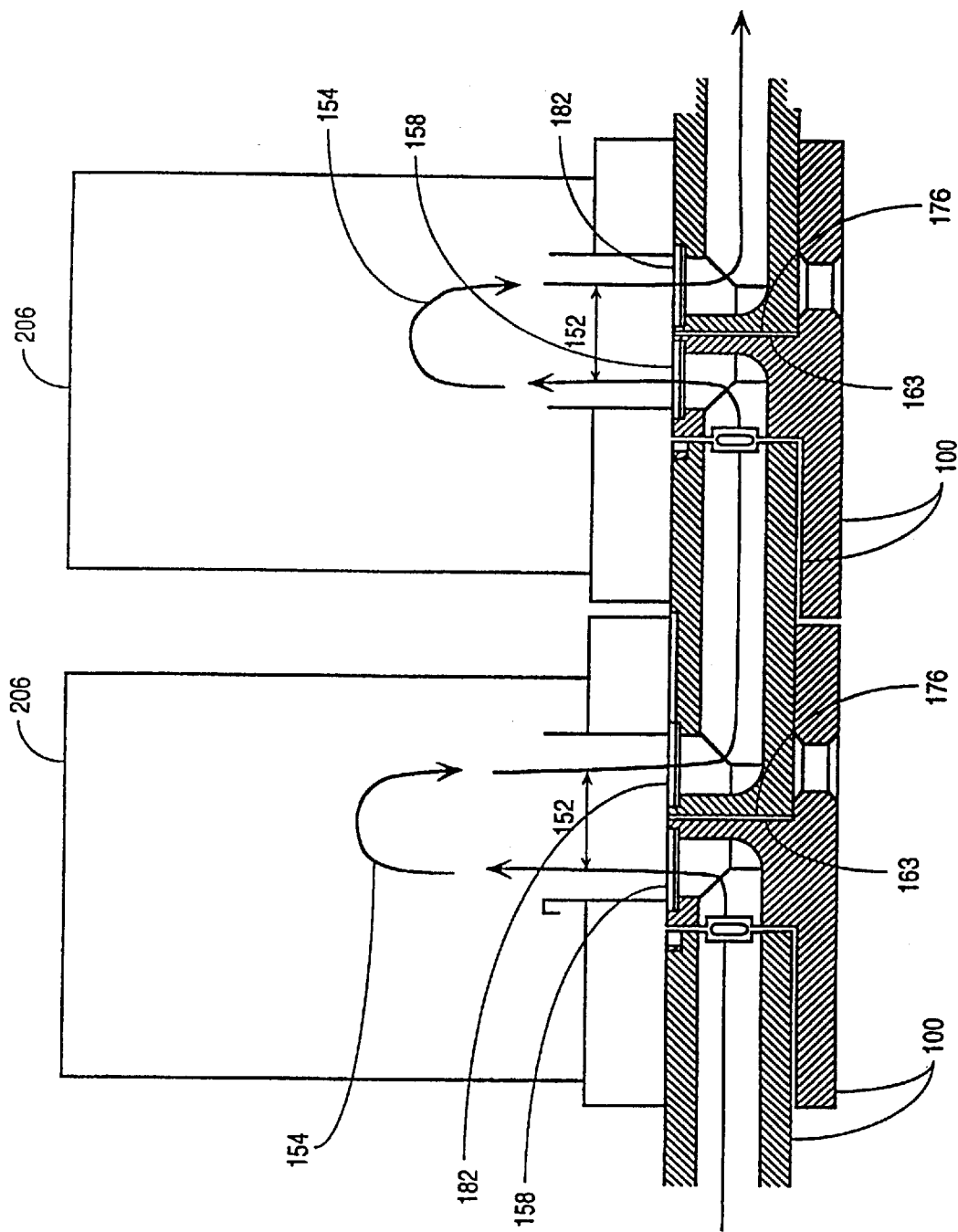
FIG. 14b is a cross-section showing gas flow through substrates and components.

Shown in FIG. 14a is an illustration of components 206 connected to substrates 100. When the components 206 are fastened over two substrates 100, the components 206 cover a port of each substrate 158/182, the body undercut second back face 163 (FIG. 14B shown later), the insert first end 176, and the factory seal 155 of a substrate 100. However, each component 206 is not centered over the two ports 158/182 as with the previously mentioned three-port arrangement (FIGS. 11b & c).

Referring to FIG. 14b is shown a cross section of components 206 and substrates 100. It can be seen that although the substrates 100 are mechanically connected to each other they do not form a sealed gas path directly between substrates 100. Instead, at assembly with a component 206, the first port 158 of one substrate 100 and a second port 182 of the other substrate 100 provide flow in and out of the component 206. In this manner, when a series of substrates 100 are connected to components 206, the output of an upstream component 206 becomes the input of a downstream component 206 and flow is directed into net 180-degree turns 154 as it passes through each component 206 and net 180 degree turns 154 as it passes through each substrate 100. It is to be understood that although only one type of substrate 100 was shown, any of the substrates 100, 50, 200, 300 may connect in this manner to pass flow along a stick 202.

Figure 15A:
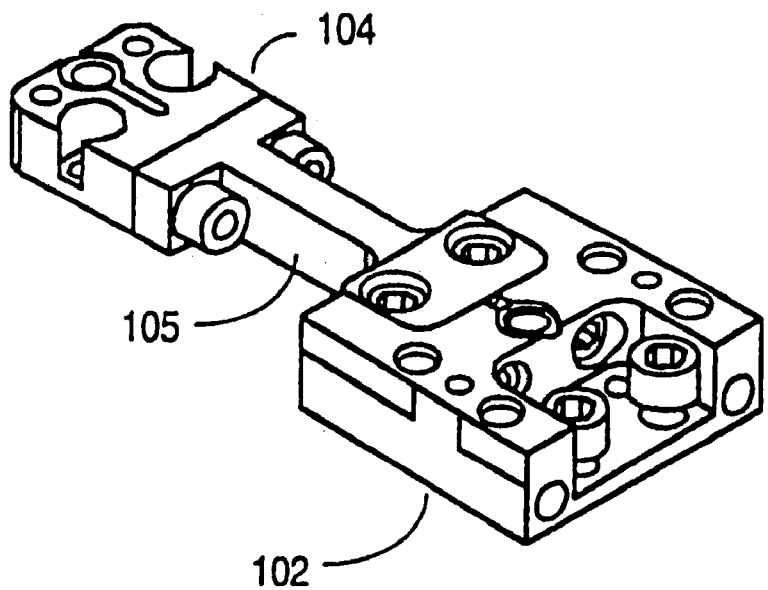
FIG. 15a is an illustration of a body, an extension, and an insert assembly.

Referring to FIGS. 15a & b there is shown an extension 105 used in manifold sections 204 to by-pass a stick 202 (FIG. 1) and so no flow interconnection with that stick 202 is desired. Additionally, an extension 105 may be used where no component 206 (FIG. 1) is placed at a location and the substrates 100, 200, 300 of a stick 202 (FIG. 1) must extend or jump to the next component 206 location (FIG. 1).

Figure 15B:
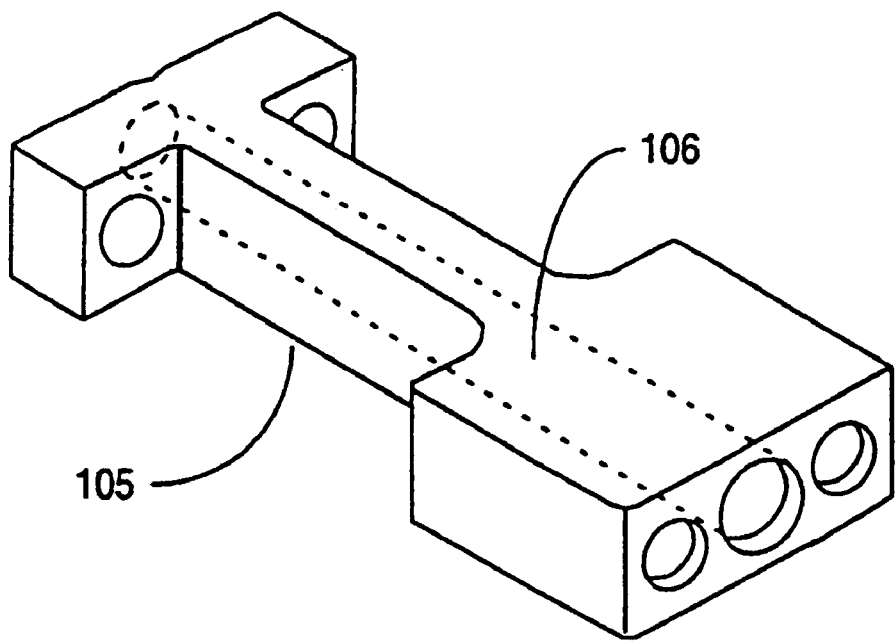
FIG. 15b is an illustration of an extension.

To provide for these occasions, a body 101, 103, 201, 301, an extension 105, and an insert 102, 104, (also 109, 111 shown later) assemble to connect gas flow to: the next component 206, an inlet/outlet fitting 214, or the next stick 202. It is to be appreciated that inserts 102, 104, (also 109 & 111 shown later) and extensions 105 may be of varying lengths to accomplish the connection. As shown in FIG. 15b, the extension 105 has a 0.180" diameter channel 106 running the length to pass flow between two connecting blocks. Returning to FIG. 15a, at each end of the extension 105, flow connections are provided by factory seals (not shown) assembled into seal joints (not shown) by authorized personnel.

Referring to FIG. 16 is shown a plug 109. A plug connects to a stick end 202 for the purpose of stopping flow. A plug 109 has no channeling but has a 0.29" dia.×0.030" DP counterbore 110 to mate with a seal 155 (not shown) and block flow coming from a channel in the mating base 101, 103, 201, 301 (not shown).

Shown in FIG. 17 is a tube weld insert 111 having a channel 113 which transitions 90-degrees within. The tube weld insert 11 can connect to a base at one end and at the other end, by threads or a weld, connect to an inlet/outlet port 214 such as a VCR couple for input from a gas source or outlet to equipment. Another form of tube weld insert (not shown) provides a straight channel with no bend.

Figure 18:
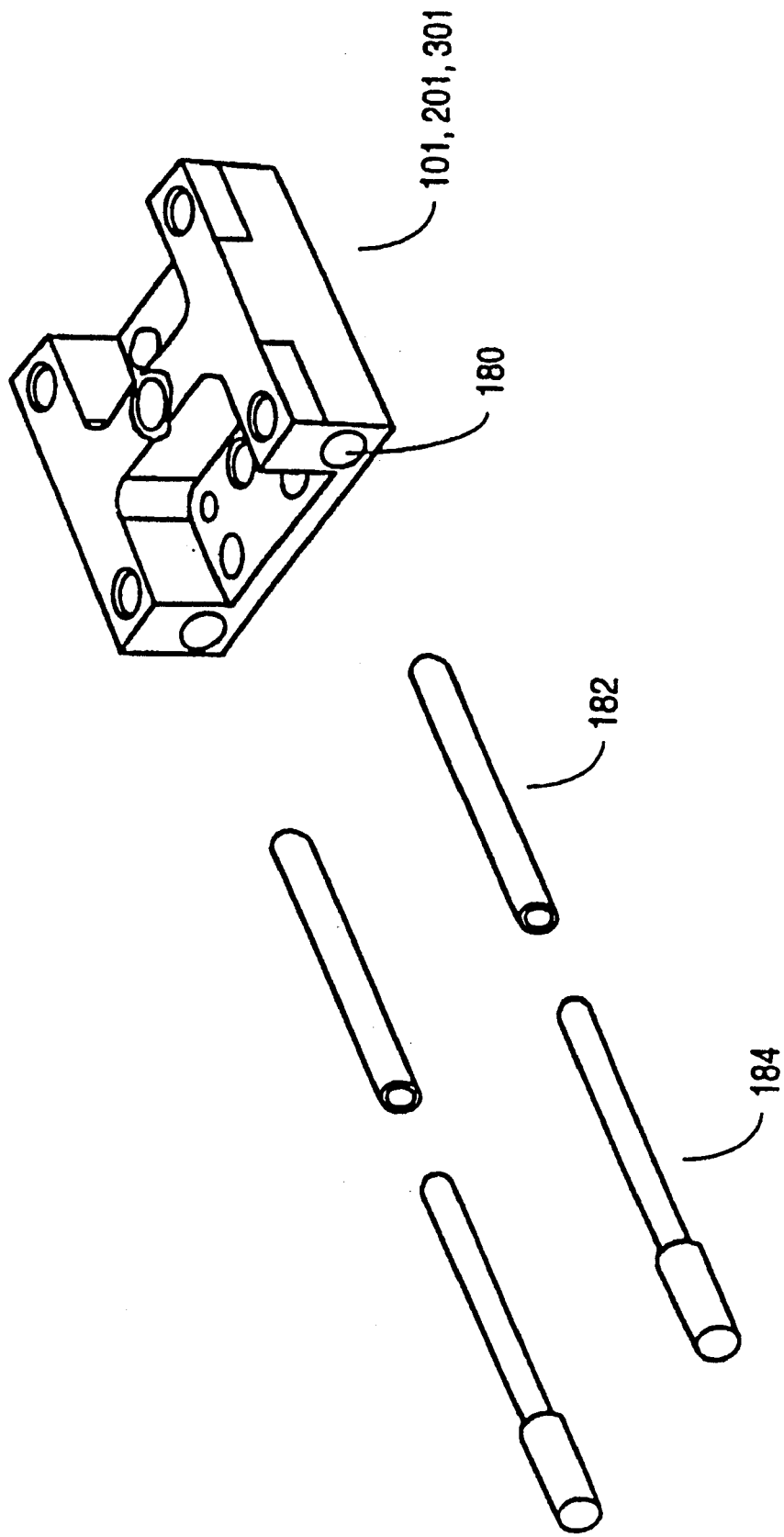
FIG. 18 is an exploded view of a body, heat conductive sleeves, and cartridge heaters.

Turning now to FIG. 18, the present invention provides for passages 180 in the various bodies 101, 201, 301 which align so that long cartridge heaters can be incorporated into the stick assembly 202 (FIG. 1). Heat conductive sleeves 182 are inserted into these passages 180 to provide thermal coupling between a heating element 184 and the bodies 101, 201, 301 in a completed stick 202 (FIGS. 1 & 2a, b) or manifold assembly 204 (FIGS. 1 & 2a, b). In this way, process fluids can be preheated prior to entry into a process chamber.

Figure 19:
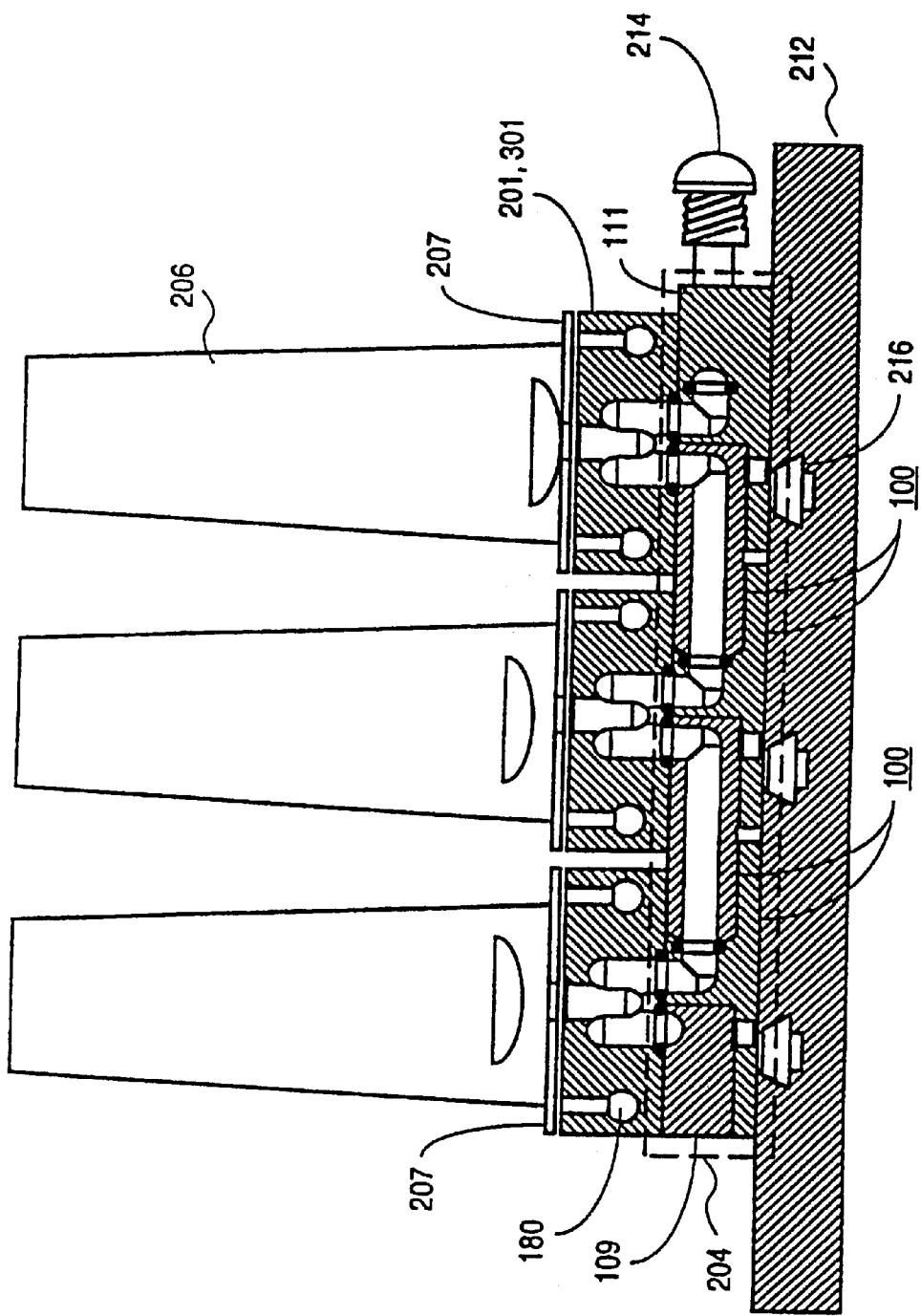
FIG. 19 is a cross-section of a manifold assembly.

Turning to FIG. 19, is seen a cross-section of a manifold assembly 204 at the end of a stick 202. Constructing a manifold 204 begins with a substrate 100. The manifold substrate 100 connects to a body 201, 301 in the component substrate level to transfer flow between the two levels. At the manifold assembly 204 ends, the substrates 100 may be connected to end inserts (plugs) 109 to block flow or to a tube weld insert 111 which connects to an inlet/outlet fitting 214.

In between the components 206 and the component substrates 100, 200, 300 are placed keepers 207 to aid assembly by insuring proper seal position. For the preferred embodiment, keepers are fabricated from thin (0.003" TK) metal foil.

It is to be appreciated that the choice of materials for the various substrates and building-blocks may be other than stainless steel. A variety of different metals and non-metals could be used which would meet the requirements of the present invention. The building-blocks may be machined, forged, sintered, or molded. The factory seal is a metallic seal designed to be crushed into place at assembly. However, it is possible to use seals which are not crush-seated and which are made of a metal, an elastomer, or a combination of metal and elastomer. Much of the determination for material selection centers around the types of fluids used in the fluid panel and their operating temperatures.

When assembled as a gas panel (FIGS. 1 & 2a, b), the component substrate (second) layer is fastened to components 206 (first layer) above and manifolds 204 (third layer) below. The manifolds 204 are assembled from substrates 100 and connect to the second layer of component substrates through the use of other substrate designs 200, 300. In addition, attached to the component substrate layer are the brackets 210 that attach to a support structure such as a mounting plate 212. In this manner, the component substrate or second level is bracketed to a support structure 212 below and fastens to components 206 above while fastened below the component substrate level are the manifolds 204.

Figures 20A, 20B:
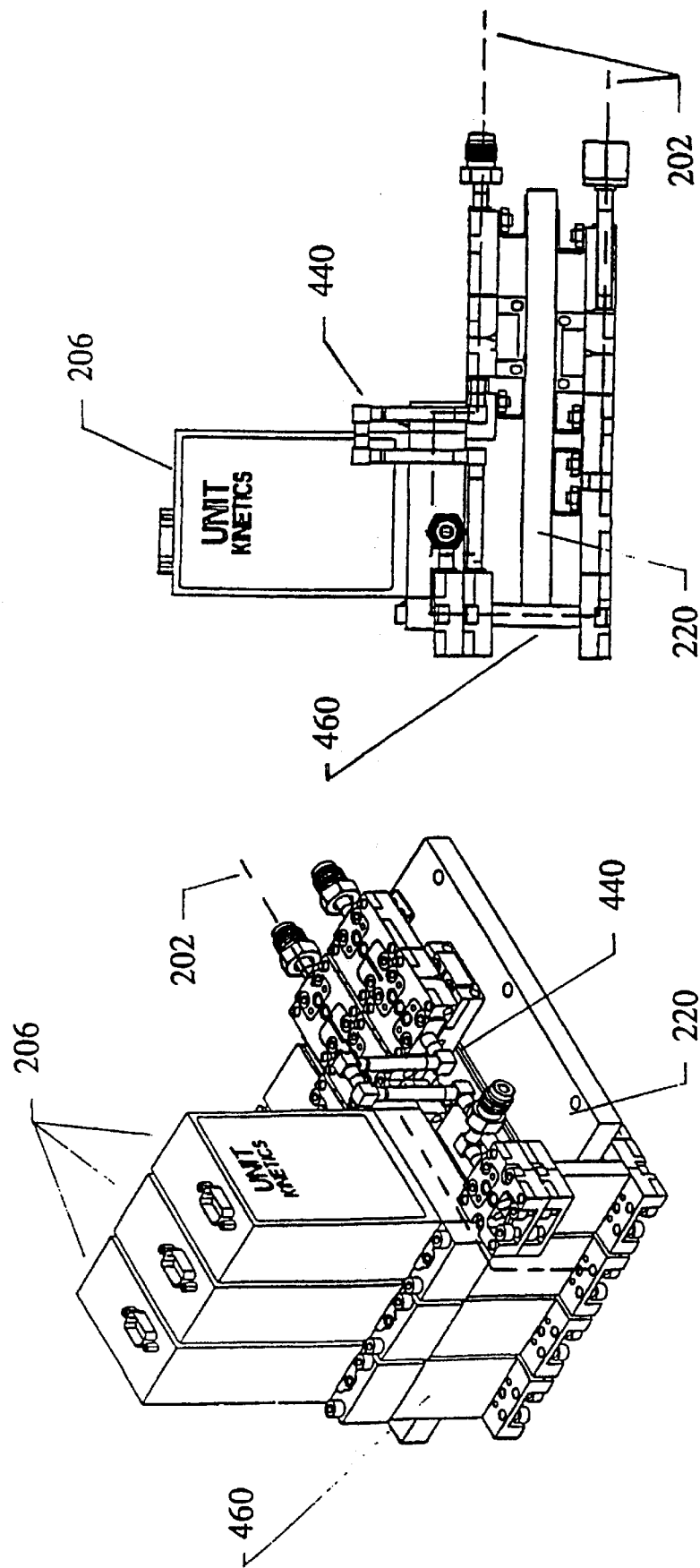
FIG. 20a is an illustration of a U-shaped fluid panel.
FIG. 20b is a cross-section of a U-shaped fluid panel.

FIGS. 20a & b illustrate an alternate embodiment of the present invention. With the preferred embodiment, one overall dimension of a fluid panel was primarily defined by the length of the sticks. With this alternate approach, a fluid panel can be assembled in which that length is reduced by folding the sticks 202 into a U-shape around a shortened support structure 220. The component's 206 functioning end (having the in and out ports) always faces the support structure 220 so that components 206 on one side of the support structure 220 are opposing components 206 on the other side of the support structure 220. With the exception of the mass flow controllers, the components are not shown in FIGS. 20a & b to more clearly show the design aspects of the "U" shape. The sticks 202 are attached with brackets 210 to both sides of the support structure 220. At the fold or bend, a bridge substrate 460 is used to connect the channels of the sticks 202 on one side of the support structure 220 to their counterpart channels on the opposite side of the support structure 220 thereby maintaining the fluid connections. Within a stick 202, a fluid may still travel the same distance as non-folded designs but since the sticks 202 are curved back on themselves in a U-shape, the overall fluid panel dimension that was driven by stick 202 length is reduced. In this manner, it is possible to package a fluid panel system into more demanding or specialized dimensional environments.

A portion of channeling made up of tubes assembled into a curved shape is used as a flex-joint 440. This section of the overall stick channeling has been added to provide dimensional flexibility within the stick 202 to reduce the necessity for tighter tolerancing needed to bridge a long space with a rigid block or substrate.

Figures 21A, 21B:
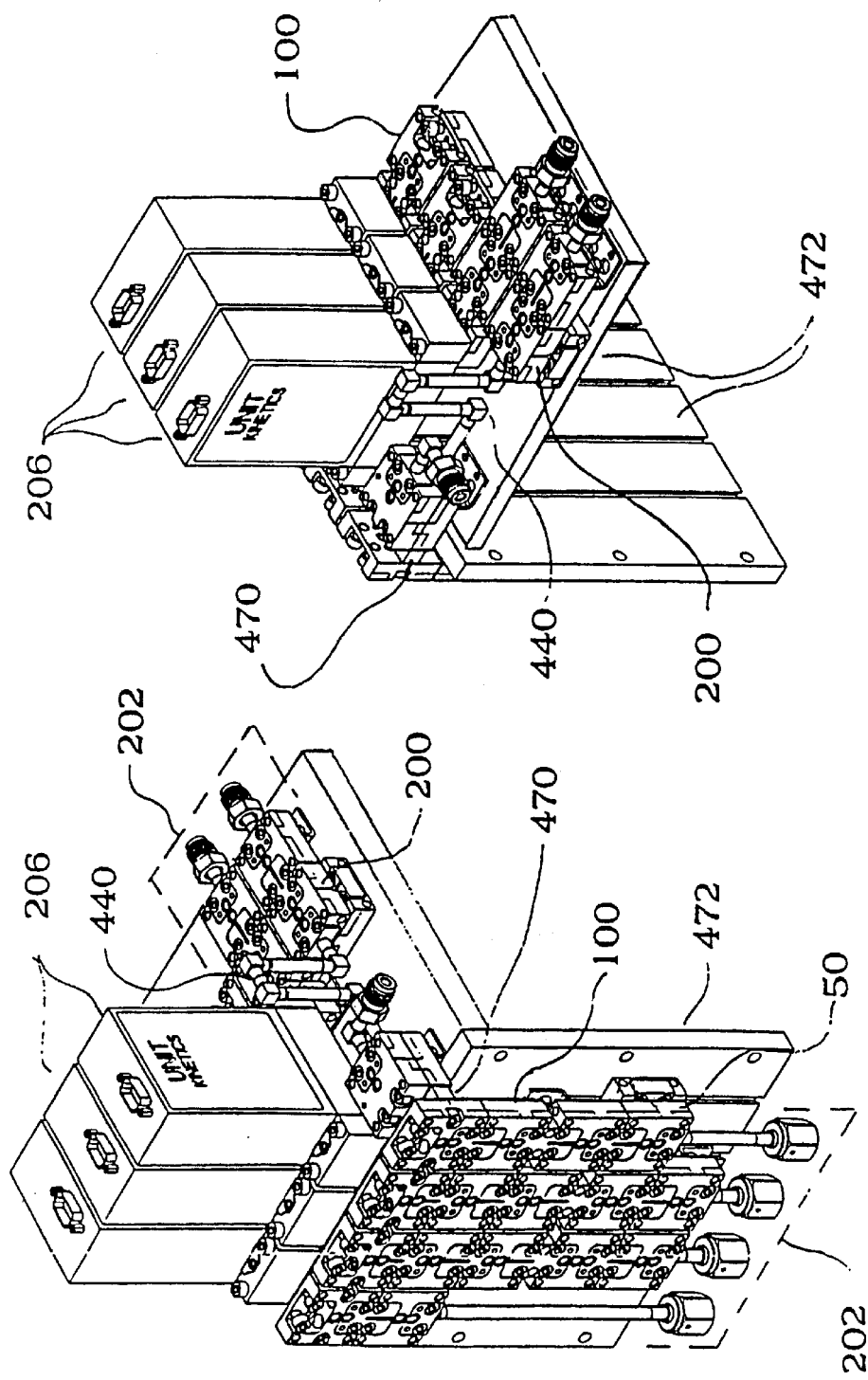
FIG. 21a is an illustration of an L-shaped fluid panel.
FIG. 21b is an illustration of an L-shaped fluid panel.

Turning now to FIGS. 21a & b is shown another alternate embodiment, an L-shaped fluid panel design. With this design, the support structuring 472 allows the sticks to make a 90-degree turn or bend. The sticks 202 are not complete, many of the components 206 are missing so that the repeating pattern of some of the substrates 50, 100, 200 can be clearly seen. Again, a bridge substrate 470 is needed to complete the turn. As with the previous alternate embodiment (FIGS. 20a & b), the stick path length for the fluid is maintained while tailoring the overall gas panel dimensions to meet specific size requirements. As with the previous alternate embodiment, a flex-joint 440 may be used within a stick 202.

It should be appreciated that a fluid panel of the present invention is not required to maintain a particular identity of components or substrates on a single plane or level. It is entirely possible for any of the 1–4 levels mentioned to follow any path. A "U", "L", or even a "Z" (not shown) shape is possible but not inclusive to meet dimensional requirements. It is also possible with an alternate embodiment to have one or more individual sticks turning or interspersed within several levels such that no ascertainable level exists.

Referring now to FIG. 22 is shown simplified cross-sections of the various bases, inserts and bridges. This figure provides a convenient illustration of fluid flow through most of the basic building blocks in the present invention.

Figure 23:
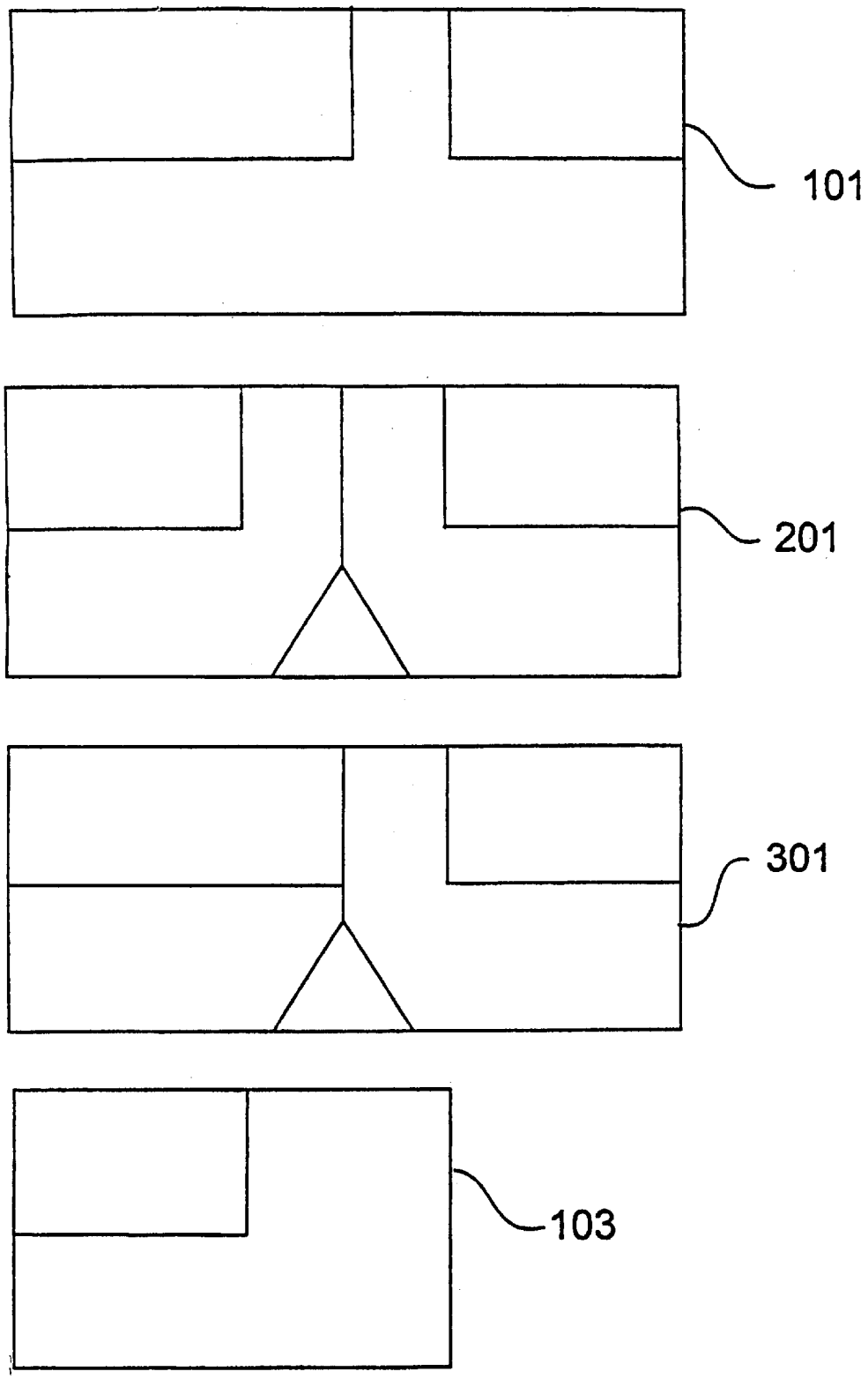
FIG. 23 is an illustration of various blocks displaying flow markings.

Referring now to FIG. 23 there are seen a set of markings that are placed along the sides of the various bodies 101, 103, 201, 301 to show the location of channels. The markings provide information on the channel positions and thus the gas flow when the bodies 101, 103, 201, 301 are coupled to the inserts 102, 104, 109, 111.

I claim:

1. A fluid panel subassembly comprising:
    a component;
    a substrate including:
        a substrate seal;
        a body including an undercut having a back surface; and
        an insert including: two ports; a fluid channel connected to the two ports; an inlet outlet/fitting connected to the first of the two ports; an end being constructed and arranged so that when the insert end is positioned within the body undercut, the component is connected to the second of the two ports and superposes the undercut back surface and the insert end;
    wherein the body is fastened to the insert with the seal therein and the component is fastened to the body so that the component is positioned over the substrate seal.

2. A fluid panel subassembly for mounting a fluid component, comprising:
    a first substrate that includes:
        a substrate body; and
        a substrate insert;
    wherein the substrate insert includes a first end with an end port, a second end, a top surface with a first top port, and a fluid channel connecting the end port and the first top port; and
    wherein the substrate insert is fastened to the substrate body and provides a fluid path between the first substrate and a first fluid component when the first fluid component is assembled to the substrate body.

3. The fluid panel subassembly of claim 2, wherein:
    the substrate body includes a first undercut having a backface; and
    the second end of the substrate insert is constructed and arranged so that when the second end of the substrate insert is positioned within the first undercut and the first fluid component is assembled to the substrate body, the first fluid component is fluidly connected to the top port of the substrate insert and the first fluid component superposes the backface and the second end of the substrate insert.

4. The fluid panel assembly of claim 3, wherein the top surface of the substrate insert further includes a second top port.

5. The fluid panel subassembly of claim 2, wherein:
    the substrate body includes a first undercut having a backface; and
    the first end of the substrate insert is fluidly connected to the substrate body.

6. The fluid panel subassembly of claim 5, further comprising:
    a substrate seal positioned between the first end of the substrate insert and the backface of the first undercut of the substrate body.

7. The fluid panel subassembly of claim 6, wherein:
    the substrate body includes a second undercut having a backface; and
    the second undercut is constructed and arranged so that when the first fluid component is assembled to the substrate body, the first fluid component is positioned over the backface of the first undercut and the backface of the second undercut.

8. The fluid panel subassembly of claim 7, wherein:
    the first end of the substrate insert is constructed and arranged so that when the first end of the substrate insert is positioned within the first undercut of the substrate body, the first fluid component superposes the backface of the first undercut of the substrate body, the substrate seal, and the first end of the substrate insert.

9. The fluid panel subassembly of claim 8, wherein the backface of the first undercut includes a backface port constructed and arranged so that when the substrate insert is fastened to the substrate body, the end port of the first end of the substrate insert is positioned adjacent to the backface port with a substrate seal therebetween.

10. The fluid panel subassembly of claim 9, wherein:
    the substrate body further includes a top surface having a top port and a top channel fluidly connecting the top port to the backface port; and
    the first fluid component is fluidly connected to the top port of the substrate body when assembled to the substrate body.

11. The fluid panel subassembly of claim 8, wherein the substrate body further includes:
    a backface port in the backface of the first undercut;
    a top surface having a top port and a top channel fluidly connecting the top port to the backface port;
    a bottom surface having
        first and second bottom surface ports,
        a first bottom channel extending from the first bottom surface port, and
        a second bottom channel extending from the second bottom surface port;
    wherein the first and second bottom channels intersect the top channel within the substrate body.

12. The fluid panel subassembly of claim 3, wherein the substrate body includes a second undercut having a backface, the second undercut being constructed and arranged so that when the first fluid component is assembled to the substrate body, the first fluid component is positioned over the second end of the insert, the backface of the first undercut, and the backface of the second undercut.

13. The fluid panel subassembly of claim 3, wherein the substrate body includes:
    a top surface having a top port and a top channel; and
    a second undercut having a backface, the second undercut being constructed and arranged so that when the first fluid component is assembled to the substrate body, the first fluid component is positioned over the first end of the insert, the backface of the first undercut, and the backface of the second undercut.

14. The fluid panel subassembly of claim 13, wherein the substrate body includes:
    a bottom surface having first and second bottom surface ports;
    a first bottom channel extending from the first bottom surface port; and
    a second bottom channel extending from the second bottom surface port;
    wherein the first and second bottom channels intersect the top channel within the substrate body.

15. The fluid panel subassembly of claim 14, wherein the top surface of the substrate insert further includes a second top port.

16. The fluid panel subassembly of claim 5, wherein the top surface of the substrate insert further includes:
a second top port having a fluid channel that intersects the fluid channel connecting the end port of the substrate insert and the first top port of the substrate insert.

17. The fluid panel subassembly of claim 16, further comprising:
a substrate seal positioned between the backface of the first undercut and the end port of the substrate insert.

18. The fluid panel subassembly of claim 17, wherein the substrate body includes a second undercut having a second backface, the second undercut being constructed and arranged so that when the substrate insert is fastened to the first fluid component, the first fluid component is positioned over the first end of the insert, the first backface, and the second backface.

19. The fluid panel subassembly of claim 9, wherein the substrate body is a first substrate body, the fluid panel subassembly further comprising:
a second substrate body that includes a first and a second undercut;
wherein the second end of the substrate insert is fastened to the second undercut of the second substrate body; and
wherein the first fluid component is positioned over the substrate seal and the first end of the substrate insert when assembled to the first substrate body.

20. The fluid panel subassembly of claim 19, wherein:
the first undercut of the second substrate body has through holes; and
the second end of the substrate insert has a bottom surface with pins extending therefrom, wherein the pins are positioned in the through holes.

21. The fluid panel subassembly of claim 11, further comprising:
a second substrate insert including a first end with an end port, a second end, and a top surface with a top port;
wherein the second end of the second substrate insert is positioned within the second undercut; and
wherein the first fluid component is assembled to the top port of the second substrate insert.

22. The fluid panel subassembly of claim 21, further comprising:
a second substrate and a third substrate; the second and third substrates each including a substrate body having a top surface and a substrate top port, and a substrate insert and a substrate seal therebetween;
wherein the substrate top port of the second substrate body is connected to the first bottom surface port of the first substrate body, and the substrate top port of the third substrate body is connected to the second bottom surface port of the first substrate body, providing a continuous fluid flow path between the first fluid component and all the inserts of the first, second, third substrates.

23. The fluid panel subassembly of claim 8, wherein the substrate body further includes:
a top surface with a top port and a top channel;
a bottom surface having a first bottom surface port and a first bottom channel and a second bottom surface port and a second bottom channel;
wherein the first and second bottom channels intersect the top channel within the substrate body.

24. The fluid panel subassembly of claim 23, wherein the substrate body is a first substrate body, the fluid panel subassembly further comprising:
a second substrate and a third substrate, the second and third substrates each having a substrate body having a top surface and a substrate top port, a substrate insert, and a substrate seal therebetween;
wherein the substrate top port of the second substrate body is connected to the first bottom surface port of the first substrate body, and the substrate top port of the third substrate body is connected to the second bottom surface port of the first substrate body, and the first fluid component is connected to the top surface of the first substrate body and positioned over one of the substrate seals providing a continuous fluid flow path between the first fluid component and all the inserts of the first, second, and third substrates.

25. The fluid panel subassembly of claim 2, wherein the fluid panel subassembly comprises a plurality of first substrates each including a substrate body, a substrate seal, and a substrate insert.

26. The fluid panel subassembly of claim 25, further comprising:
a plurality of second substrates each including a substrate body, a substrate seal, and a substrate insert, wherein each second substrate body includes a first undercut and a second undercut constructed and arranged so that when a respective second substrate body is assembled to a fluid component, the fluid component is positioned over the first backface and the second backface of the respective second substrate body;
a plurality of third substrates each including a substrate body, a substrate seal, and a substrate insert, wherein each respective third substrate body includes a top surface port, a top channel extending from the top surface port, and a first bottom surface port and a second bottom surface port in the bottom surface of the respective third substrate body, with a first bottom channel extending from the first bottom surface port and a second bottom channel extending from the second bottom surface port; wherein the first and second bottom channels intersect the top channel within the respective third substrate body; and
a plurality of fluid components constructed and arranged so that each of the plurality of fluid components superpose at least one substrate seal.

27. The fluid panel subassembly of claim 26, further comprising:
a fourth substrate having a substrate body constructed and arranged between two substrates selected from the group consisting of: the first substrate, the second substrate, the third substrate, and the fourth substrate, so that when assembled, one of the plurality of fluid components opposes another of the plurality of fluid components.

28. The fluid panel subassembly of claim 26, further comprising:
a support structure having a first side and a second side that is perpendicular to the first side; and
a fourth substrate having a substrate body constructed and arranged between two substrates selected from the group consisting of: the first substrate, the second substrate, the third substrate, and the fourth substrate, so that when assembled, one of the plurality of fluid components is positioned on the first side of the support structure and another of the plurality of fluid components is positioned on the second side of the support structure.

* * * * *